(12) United States Patent
Fukushima et al.

(10) Patent No.: US 11,163,853 B2
(45) Date of Patent: Nov. 2, 2021

(54) SENSOR DESIGN SUPPORT APPARATUS, SENSOR DESIGN SUPPORT METHOD AND NON-TRANSITORY COMPUTER READABLE MEDIUM

(71) Applicant: KABUSHIKI KAISHA TOSHIBA, Tokyo (JP)

(72) Inventors: Arika Fukushima, Tokyo (JP); Myungsook Ko, Tokyo (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 435 days.

(21) Appl. No.: 15/696,352

(22) Filed: Sep. 6, 2017

(65) Prior Publication Data

US 2018/0189242 A1 Jul. 5, 2018

(30) Foreign Application Priority Data

Jan. 4, 2017 (JP) .............................. JP2017-000249

(51) Int. Cl.
| | |
|---|---|
| G06F 17/10 | (2006.01) |
| G06F 17/18 | (2006.01) |
| G06F 11/30 | (2006.01) |
| G06N 20/00 | (2019.01) |
| G06F 30/00 | (2020.01) |

(52) U.S. Cl.
CPC .......... *G06F 17/18* (2013.01); *G06F 11/3024* (2013.01); *G06F 11/3089* (2013.01); *G06F 30/00* (2020.01); *G06N 20/00* (2019.01)

(58) Field of Classification Search
CPC ...... G06F 17/18; G06F 17/50; G06F 11/3024; G06F 11/3089; G06N 20/00
(Continued)

(56) References Cited

U.S. PATENT DOCUMENTS

| 9,384,603 B2 | 7/2016 | Ishikawa et al. | |
|---|---|---|---|
| 2012/0136629 A1* | 5/2012 | Tamaki .............. | G05B 23/0254 702/183 |

(Continued)

FOREIGN PATENT DOCUMENTS

| EP | 2 477 086 A1 | 7/2012 |
|---|---|---|
| JP | 2015-184942 | 10/2015 |

(Continued)

OTHER PUBLICATIONS

Dong et al. (Advances in Multi-Sensor Data Fusion: Algorithms and Applications, (14 pages)). (Year: 2009).*

(Continued)

*Primary Examiner* — Andre Pierre Louis
(74) *Attorney, Agent, or Firm* — Finnegan, Henderson, Farabow, Garrett & Dunner L.L.P.

(57) ABSTRACT

According to one embodiment, a sensor design support apparatus includes: an inter-data feature calculator and a model constructor. The inter-data feature calculator combines any two pieces of data based on first to k-th data acquired from each of a plurality of sensors in response to first to k-th conditions being satisfied to generate a plurality of data pairs for each of sensors, the sensors monitoring a target; and calculates a plurality of inter-data features based on the plurality of data pairs. The model constructor calculates a plurality of coefficients corresponding to the plurality of inter-data features in a classification model based on state data indicating states of the monitoring target at times which the first to k-th conditions are satisfied, wherein the classification model associates the plurality of coefficients and the plurality of inter-data features with a value identifying a state of the monitoring target.

9 Claims, 20 Drawing Sheets

(58) Field of Classification Search
USPC .............................................................. 703/2
See application file for complete search history.

(56) References Cited

U.S. PATENT DOCUMENTS

| | | |
|---|---|---|
| 2013/0116991 A1 | 5/2013 | Hido |
| 2013/0116992 A1 | 5/2013 | Hido |
| 2015/0112891 A1 | 4/2015 | Watanabe et al. |
| 2016/0235242 A1 | 8/2016 | McHugh et al. |

FOREIGN PATENT DOCUMENTS

| | | |
|---|---|---|
| WO | WO 2011-036809 | 3/2011 |
| WO | WO 2013-069565 | 5/2013 |
| WO | WO 2013-187295 | 12/2013 |
| WO | WO 2016-079972 | 5/2016 |
| WO | WO 2016-084326 | 6/2016 |
| WO | WO 2016-133856 | 8/2016 |

OTHER PUBLICATIONS

Liu et al., "Effective Sensor Selection and Data Anomaly Detection for Condition Monitoring of Aircraft Engines," Sensors (2016), pp. 1-17.
"Logistic regression," Wikipedia (Jan. 3, 2018), pp. 1-15.
"Support vector machine," Wikipedia (Dec. 9, 2016), pp. 1-17.
Hui Zou et al., "Regularization and variable selection via the elastic net", J. R. Statist. Soc. B, vol. 67, Part 2, pp. 301-320 (2005).

* cited by examiner

| SENSOR ID | LEARNING DATA ID | TIME 1 | TIME 2 | TIME 3 | ... | TIME T |
|---|---|---|---|---|---|---|
| 1 | 1 | 2.1 | 7.4 | 9.5 | ... | 6.9 |
| 1 | 2 | 3.6 | 2.9 | 2.4 | ... | 1.9 |
| 1 | 3 | 1.8 | 5.2 | 6.3 | ... | 8.6 |
| ... | ... | ... | ... | ... | ... | ... |
| n | k-1 | 4.2 | 1.3 | 2.1 | ... | 2.7 |
| n | k | 1.2 | 4.9 | 4.7 | ... | 6.3 |

| LEARNING DATA ID | CLASSIFICATION LABEL |
|---|---|
| 1 | 1 |
| 2 | 0 |
| 3 | 1 |
| ... | ... |
| k-1 | 1 |
| k | 0 | k LINES

CLASSIFICATION LABEL
1: NORMAL
0: ANOMALOUS

FIG. 10 n PIECES

| LEARNING DATA ID OF $S_n$ | 1 | 2 | ... | k |
|---|---|---|---|---|

| LEARNING DATA ID OF $S_2$ | 1 | 2 | ... | k |
|---|---|---|---|---|

| LEARNING DATA ID OF $S_1$ | 1 | 2 | ... | k |
|---|---|---|---|---|
| 1 | 0 | $x_{1,2}$ | ... | $x_{1,k}$ |
| 2 | $x_{2,1}$ | 0 | ... | $x_{2,k}$ |
| ... | ... | ... | ... | ... |
| k | $x_{k,1}$ | $x_{k,2}$ | ... | 0 |

FIG. 11

INTER-DATA FEATURE TABLE OF 1ST SENSOR

| センサ $S_1$ | 1 | 2 | ... | k |
|---|---|---|---|---|
| 1 | 0 | | | |
| 2 | | 0 | | |
| ... | | | ... | ... |
| k | | | ... | 0 |

INTER-DATA FEATURE TABLE OF 2ND SENSOR

| センサ $S_2$ | 1 | 2 | ... | k |
|---|---|---|---|---|
| 1 | 0 | | | |
| 2 | | 0 | | |
| ... | | | ... | ... |
| k | | | ... | 0 |

⋮

INTER-DATA FEATURE TABLE OF n-TH SENSOR

| センサ $S_n$ | 1 | 2 | ... | k |
|---|---|---|---|---|
| 1 | 0 | | | |
| 2 | | 0 | | |
| ... | | | ... | ... |
| k | | | ... | 0 |

EXPLANATORY VARIABLE TABLE n*k COLUMNS

| SENSOR ID, LEARNING DATA ID | 1,1 | 1,2 | ... | 1,k | 2,1 | 2,2 | ... | 2,k | ... | n,1 | n,2 | ... | n,k |
|---|---|---|---|---|---|---|---|---|---|---|---|---|---|
| 1 | 0 | | | | 0 | | | | | 0 | | | |
| 2 | | 0 | | | | 0 | | | | | 0 | | |
| ... | | | ... | ... | | | ... | ... | | | | ... | ... |
| k | | | ... | 0 | | | ... | 0 | | | | ... | 0 |

FIG. 12

| SENSOR ID | SAMPLING FREQUENCY [Hz] | UNIT PRICE OF SENSOR [YEN] | CONTINUOUS OPERATING TIME [min] | ... | AMOUNT OF POWER CONSUMPTION [kWh] |
|---|---|---|---|---|---|
| 1 | 100 | 2,000 | 20 | ... | 5.0 |
| 2 | 1000 | 5,000 | 100 | ... | 3.2 |
| 3 | 2000 | 10,000 | 100 | ... | 2.9 |
| ... | ... | ... | ... | ... | ... |
| n-1 | 10 | 100 | 10 | ... | 7.2 |
| n | 500 | 3,500 | 300 | ... | 8.0 |

| CONSTRUCTED MODEL | IDENTIFICATION RATE [%] | TOTAL COST [YEN] (OPERATION: 5 YEARS) |
|---|---|---|
| MODEL 1 | 98 | 2 MILLION |

SELECTION FOR VERTICAL AXIS
- PROCESSING TIME [SEC]
- IDENTIFICATION RATE [%]
- MODEL CAPACITY [kB]

■ : MODEL 1
CONSTRAINT: NONE

| SELECTED SENSOR ID | REPRESENTATIVE DATA [PIECES] | SAMPLING FREQUENCY [Hz] | INSTALLATION COST [YEN] |
|---|---|---|---|
| S1 | 2 | 10000 | 10,000 |
| Sn | 1 | 10000 | 20,000 |

■ : MODEL 1

IDENTIFICATION RATE [%]
TOTAL COST [YEN] (OPERATION: 5 YEARS)

SELECTION FOR HORIZONTAL AXIS
- INSTALLATION COST [YEN]
- TOTAL COST [YEN]
- SENSOR POWER [kWh]

SENSOR DESIGN SUPPORT APPARATUS, SENSOR DESIGN SUPPORT METHOD AND NON-TRANSITORY COMPUTER READABLE MEDIUM

CROSS REFERENCE TO RELATED APPLICATIONS

This application is based upon and claims the benefit of priority from the prior Japanese Patent Application No. 2017-000249, filed on Jan. 4, 2017, the entire contents of which are incorporated herein by reference.

FIELD

Embodiments described herein relate to a sensor design support apparatus, a sensor design support method and a non-transitory computer readable medium.

BACKGROUND

Recently IoT (Internet of Things) has been explosively spreading accompanying development of sensors and communication technology. A lot of attempts to acquire data from sensors attached to products to perform classification according to purposes, such as anomaly detection and state monitoring of the products have been made. On the other hand, there may be a case where enormous data obtained for such purposes includes duplicate information for the purposes. Further, in a case where highly accurate classification is possible with only a part of data, it is not necessarily required to collect enormous data. Thus, there are a lot of cases where excessive data is collected for a purpose.

As a method for selecting a sensor to be attached to a product at the time of designing the product, it is common that an expert who has knowledge of each sensor and understands mechanical characteristics of the sensor selects the sensor to be attached. In comparison, a technique of supporting sensor selection by a designer by providing information about a degree of influence of each sensor to the designer is also proposed. However, in this case also, it is necessary for a designer to select a sensor to be attached by his own judgment on the basis of the provided information. Further, in this technique, construction of a classification model using a selected sensor is not considered.

On the other hand, there exists a technique of automatically selecting a sensor to be attached to a product and constructing a classification model from data collected from the sensor. However, it is necessary for a person to manually set parameters for the automatic selection of a sensor.

BRIEF DESCRIPTION OF THE DRAWINGS

FIG. 10 is a diagram showing an example of classification label data;

FIG. 11 is a diagram showing an example of inter-data feature tables of the sensors;

FIG. 12 is a diagram showing an example of combining the inter-data feature tables of the sensors in a line direction;

FIG. 21 is a diagram showing a table storing spec data of the sensors;

FIG. 22 is a diagram showing a display example of screen data;

DETAILED DESCRIPTION

According to one embodiment, a sensor design support apparatus includes: an inter-data feature calculator and a model constructor. The inter-data feature calculator combines any two pieces of data based on first to k-th data acquired from each of a plurality of sensors in response to first to k-th conditions being satisfied to generate a plurality of data pairs for each of sensors, the sensors monitoring a target; and calculates a plurality of inter-data features based on the plurality of data pairs. The model constructor calculates a plurality of coefficients corresponding to the plurality of inter-data features in a classification model based on state data indicating states of the monitoring target at times which the first to k-th conditions are satisfied, wherein the classification model is configured to associate the plurality of coefficients and the plurality of inter-data features with a value identifying a state of the monitoring target.

Embodiments will be described below with reference to drawings.

First Embodiment

First, a summary of the present embodiment will be described using FIGS. 1 to 6.

Figure 1:
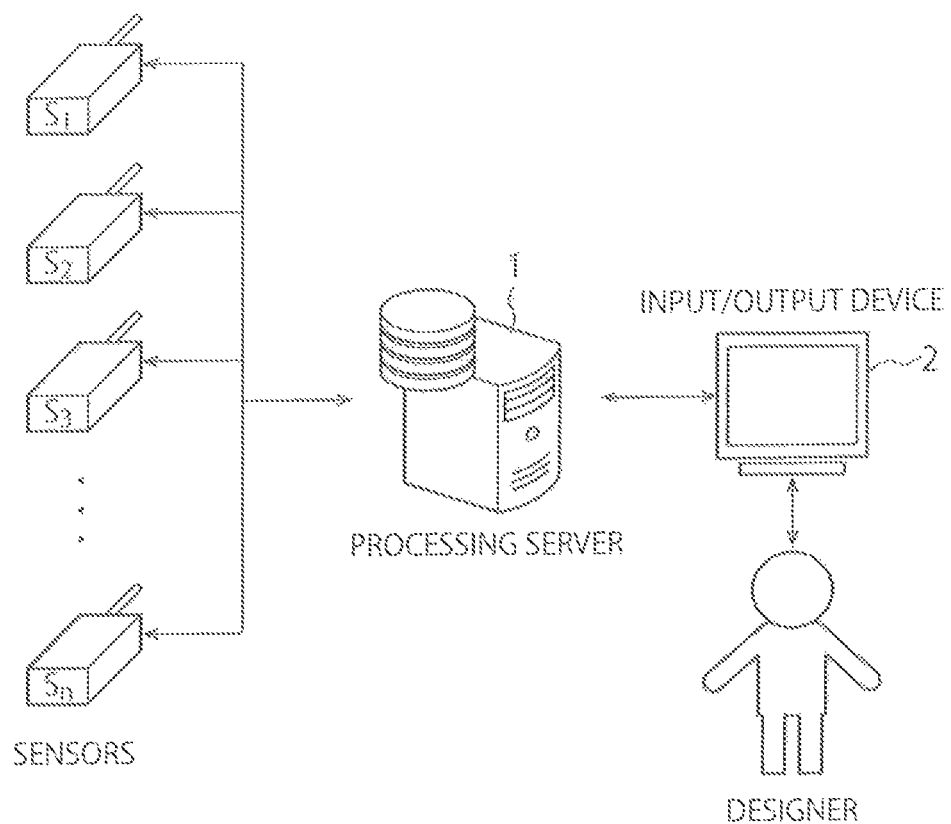
FIG. 1 is an overall configuration diagram of a system according to a first embodiment.

FIG. 1 shows an overall configuration diagram of a system according to the present embodiment. The system is provided with a processing server 1 and an input/output device 2. The processing server 1 relates to, in a scene of sensor design of selecting sensors to be attached to a certain monitoring target, automatic selection of the sensors to be attached. The processing server 1 performs automatic selection of sensors according to a classification purpose (such as anomaly detection) and construction of a classification model using the selected sensors, using sensor data acquired from any "n" sensors (n is at least 2 or larger) attached to a monitoring target to be a prototype. It is assumed that the kinds of the "n" sensors and candidates for attachment positions of the sensors are determined in advance. The sensor selection may include not only selection of sensors to be newly attached to a monitoring target from among the "n" sensors but also selection of sensors to be used, from among the "n" sensors already attached to the monitoring target. In the description below, the former case is mainly assumed. However, the latter case can be similarly performed by appropriately making necessary changes in reading.

The input/output device 2 is connected to the processing server 1 and provides an interface for input/output with a designer. The input/output device 2 displays data received from the processing server 1 on a screen and outputs data inputted from the designer via an input device to the processing server 1.

The processing server 1 provides information on sensors selected by the processing server 1 and information on a classification model constructed using the sensors, to the designer via the input/output device 2. Though the processing server 1 and the input/output device 2 are configured as separate devices in FIG. 1, they may be integrally configured.

Here, "sensor" used in the present embodiment is a generic name of equipment for observing a certain physical quantity and changing the physical quantity to a digital signal. For example, there are various sensors such as an acceleration sensor, a geomagnetic sensor, an image sensor, a humidity sensor, a temperature sensor and a piezoelectric element. A power generation device such as a thermal power generation element and a solar battery may be included in sensors. In this case, it can be thought that an amount of power generation corresponds to a sensor value.

Though an MFP (Multifunction Peripheral) is assumed as a monitoring target to which sensors are attached in the present embodiment, other products are also possible. Further, the monitoring target is not limited to a product but may be a semi-finished product or a living body. Examples of a living body include a person, an animal, a plant and the like. Furthermore, though anomaly detection of whether a state is normal or anomalous is treated as a classification purpose in the present embodiment, other classification purposes are also possible.

Figure 2:
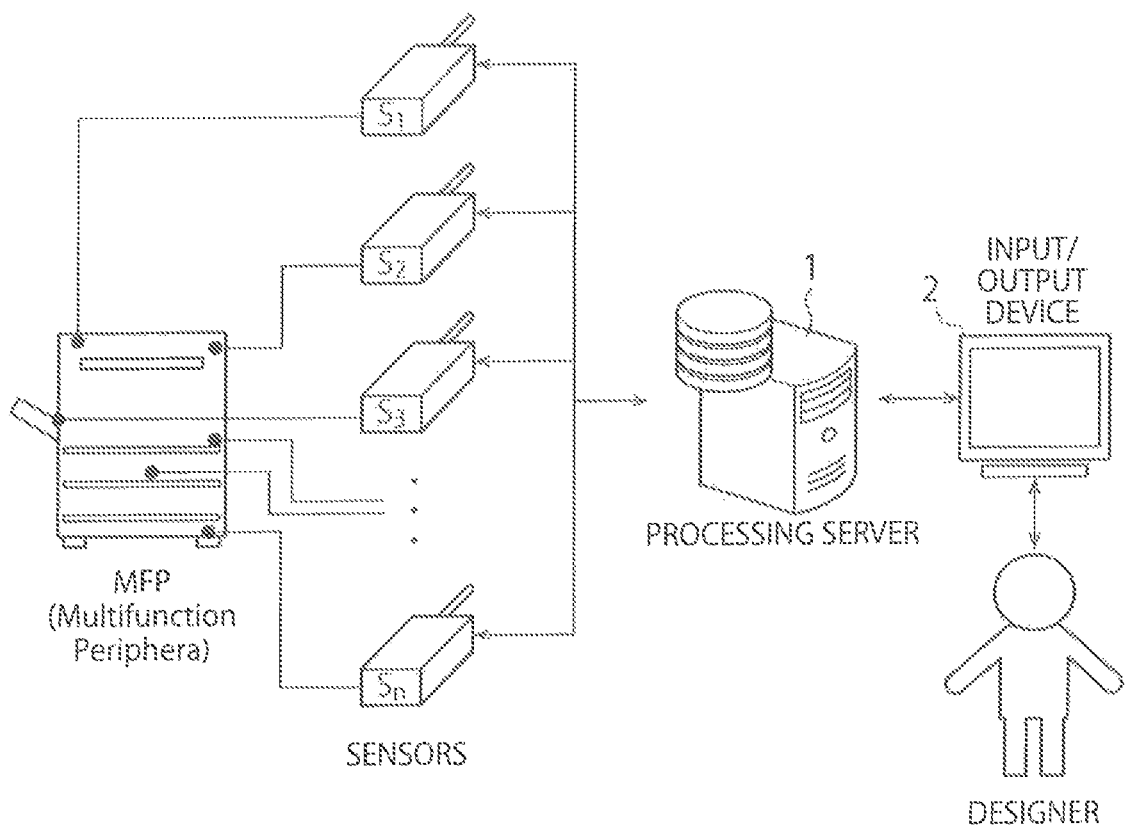
FIG. 2 is a diagram showing a state that a certain designer is performing sensor design using one prototype.

FIG. 2 shows a state that a certain designer is performing sensor design for the purpose of anomaly detection, using one prototype during development of a certain MFP. The designer attaches any "n" sensors ("n" is an integer equal to or larger than 2) to the one prototype MFP and acquires "k" pieces of sensor data from each sensor as learning data. The "k" pieces of sensor data are acquired when the first to k-th acquisition conditions (hereinafter referred to as conditions) are satisfied, respectively. Here, as the first to k-th conditions are satisfied, it is assumed that sensor data is acquired at timings when the first to k-th points of time at predetermined time intervals (every ten minutes, every one hour, or the like) arrive, respectively. As an example, the first point of time, the second point of time, . . . , and the k-th point of time may be 00:00, 01:00, . . . , 23:00, respectively. Here, from the "n" sensors attached to the MFP, "p" pieces of sensor data ("p" is a positive integer equal to or larger than 2) are acquired at the predetermined time intervals during normal operation of the MFP, and, successively, "q" pieces of sensor data ("q" is a positive integer equal to or larger than 2) are acquired at the predetermined time intervals in a state that a fault has been intentionally caused to the MFP. An interval between the p-th sensor data and the (p+1)-th sensor data is the predetermined time interval. Here, "p+q=k" is assumed.

In the above example, though the first to k-th conditions define that points of time at predetermined time intervals arrive, the first to k-th conditions are not limited thereto. Any condition is possible if sensor data is acquired when the first to k-th conditions common to monitoring target (here, the MFP) are satisfied. For example, the points of time defined by the first to k-th conditions may not arrive at predetermined time intervals. As another example, the first to k-th conditions may define that a particular event occurs. The particular event may be, for example, that a power source is turned on or that a predetermine operation is performed (for example, a particular button being pressed). The particular event may be common to the first to k-th conditions, or content of the particular event may differ among the first to k-th conditions. When the particular event is common to the first to k-th conditions, each of the first to k-th conditions may define what number in order the particular event occurs.

Figure 3:
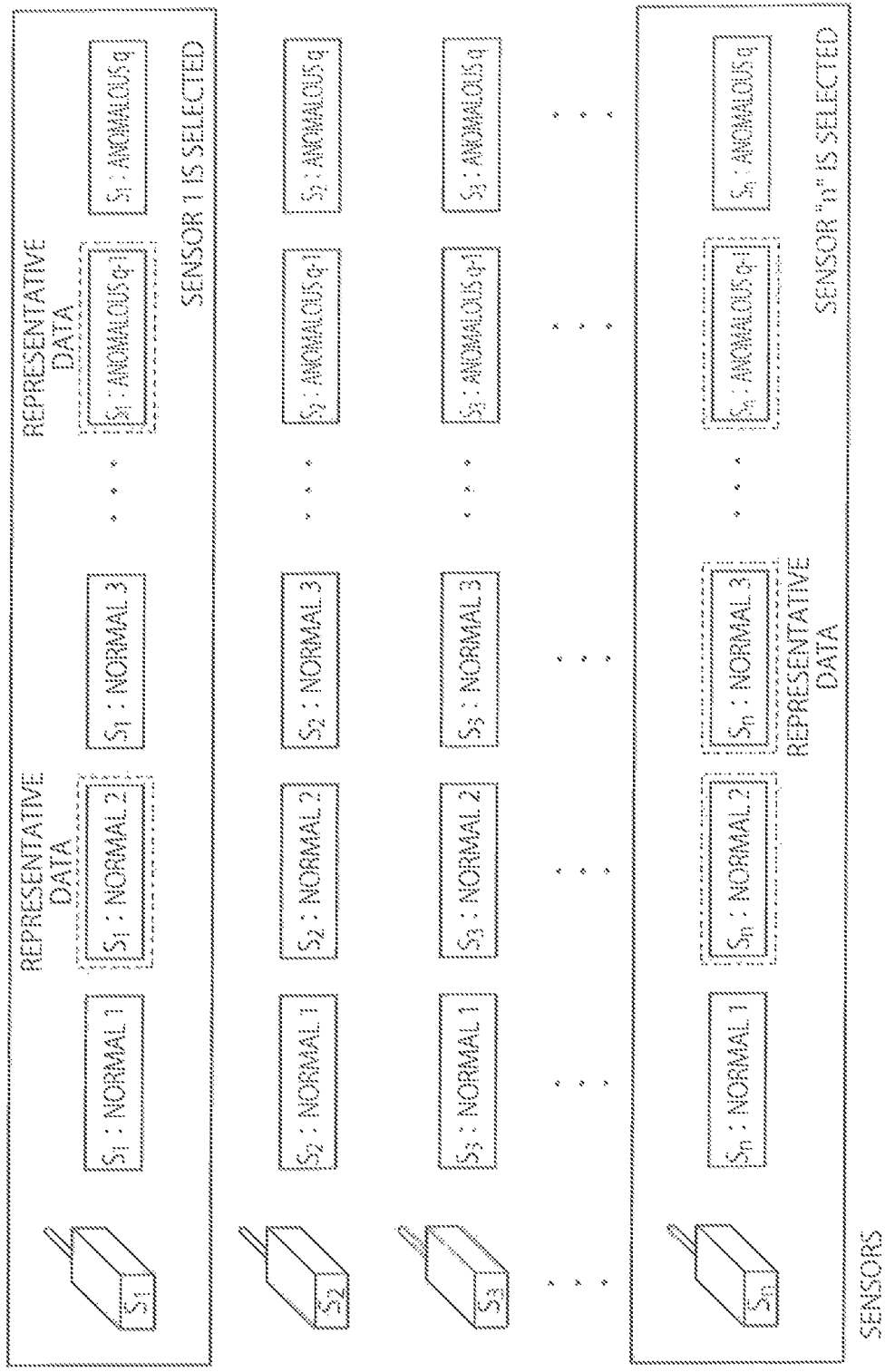
FIG. 3 is a diagram schematically showing sensor data.
Figure 4:
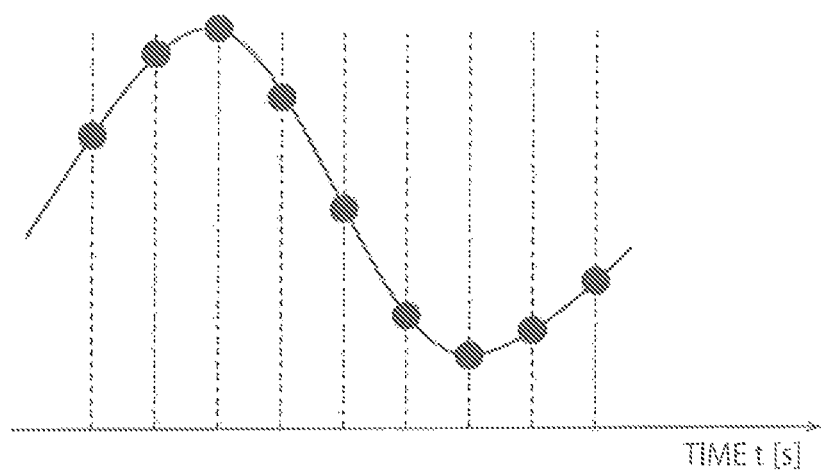
FIG. 4 is a diagram showing an example of waveform data sampled at a constant sampling frequency.

FIG. 3 schematically shows sensor data acquired from the sensors 1 to "n". In FIG. 3, "$S_i$" (i=1, 2, . . . , "n") indicates a sensor "i". For each of the sensors 1 to "n", the "p" pieces of sensor data during normal operation and the "q" pieces of sensor data at the time of anomaly are shown. That is, "n×(p+q)" pieces of sensor data is shown. Here, "p+q=k" is assumed. Each rectangle in FIG. 3 schematically shows the sensor data. Here, "$S_1$: Normal 1" surrounded by a rectangle includes sensor data acquired from the sensor 1 at the first time (when the first condition is satisfied) and a label of the sensor 1 indicating normality. An example is shown in which, though the MFP is normal when the first to p-th conditions are satisfied, the MFP is anomalous when the (p+1)-th to q-th conditions are satisfied. The sensor data may be configured as waveform data or value data. FIG. 4 shows an example of waveform data. The waveform data shows transition of a value along time. Black circles indicate values at sampling points, and an inverse of an interval between sampling points corresponds to a sampling frequency.

In a related art, a classification model, (here, a classification model for anomaly detection) is generated using "n×(p+q)" pieces of sensor data acquired from "n" sensors. As an example, the classification model outputs a value for identifying whether anomaly exists or not on the basis of all pieces of sensor data of the "n" sensors acquired at a certain point of time as an input. As an example, normality is judged when the value is equal to or above a threshold, and anomaly is judged when the value is below the threshold.

In contrast, in the present embodiment, sensors used for a classification model are automatically selected on the basis of "n×(p+q)" pieces of data as shown in FIG. 3. In this example, a case where the sensor 1 and the sensor "n" are selected is shown. Furthermore, all pieces of sensor data acquired from the selected sensors is not used, but, for each sensor, a condition for acquiring sensor data is automatically selected from among the first to k-th conditions. In a classification model, only sensor data acquired when the selected condition is satisfied is used. In the example of FIG. 3, the second condition and the (q−1)-th condition are selected for the sensor 1 as shown by broken line rectangles. For the sensor n, the third condition is selected. Among the "n×(p+q)" pieces of sensor data used for construction of the classification model (learning data), learning data acquired when the selected conditions are satisfied is referred to as representative data.

By automatically selecting sensors used for a classification model in this way, it is possible to prevent installation of unnecessary sensors at the time of mass production of MFPs. Further, by using only sensor data acquired when a selected condition is satisfied, for a classification model, it is also possible to suppress an amount of data required for a classification model (that is, the number of pieces of representative data). Further, an amount of data to be collected and a frequency of collection can be suppressed. Thereby, it is possible to make a configuration of a classification model compact. Therefore, the present embodiment makes it possible to reduce installation cost and operation cost of sensors, and cost required for execution of a classification model (for example, cost of a processor having performance required for processing of a classification model).

Figure 5:
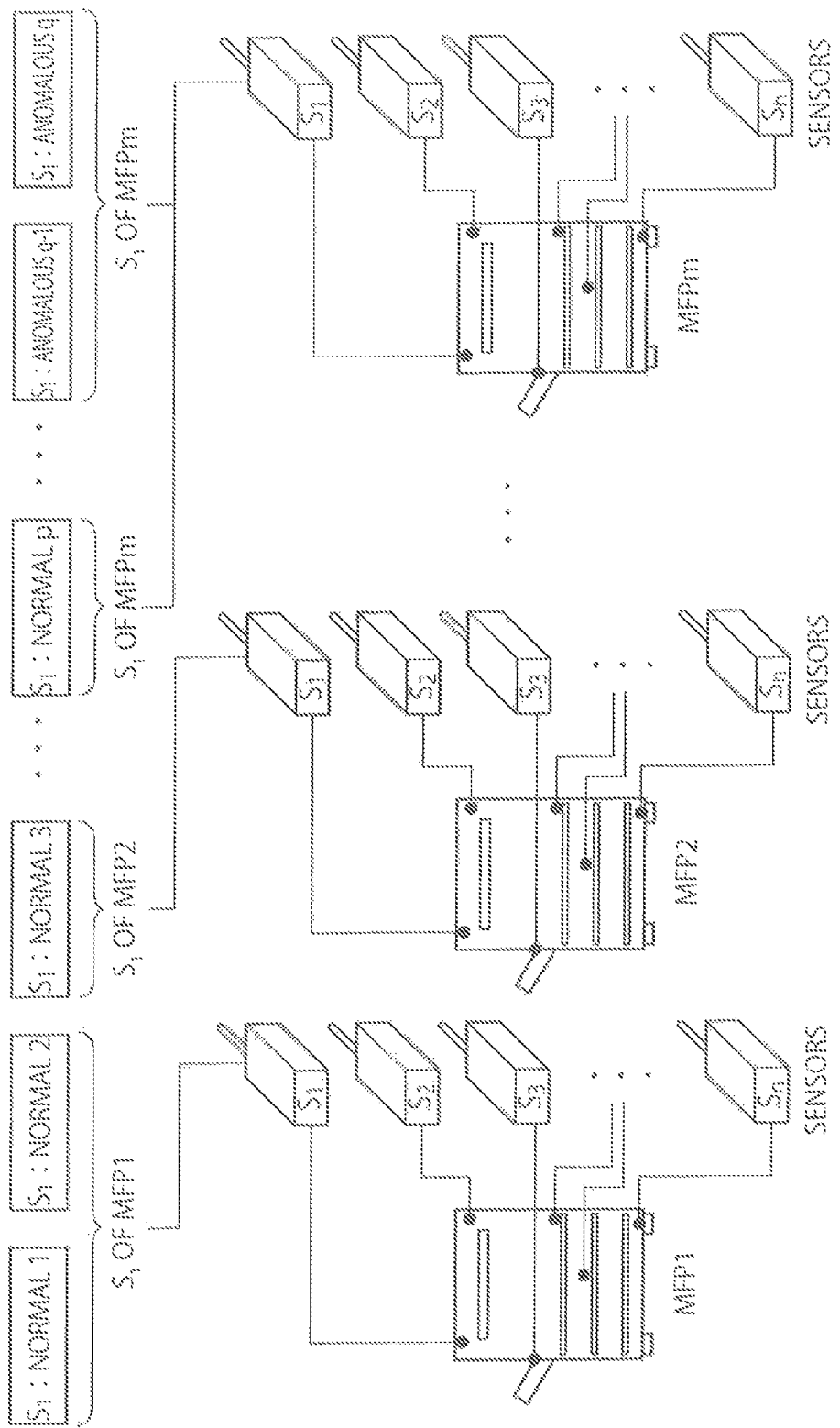
FIG. 5 is a diagram showing an example of acquiring sensor data from the number "m" of MFPs that are products released in the past.

Though sensor data is acquired from one product (MFP) in the above description, a configuration is also possible in which sensor data is acquired from a plurality of products. FIG. 5 shows an example of acquiring sensor data from the number "m" of MFPs that are products released in the past. In the case of acquiring sensor data from a plurality of products released in the past as described above also, it is possible to select sensors and construct a classification model by the present embodiment. Here, release dates of the "m" MFPs may be the same or may be different. In FIG. 5, as for the sensor 1, sensor data is acquired from an MFP1 at the first and second timings (when the first and second conditions are satisfied), from an MFP2 at the third timing (when the third condition is satisfied), . . . , and from an MFPm at the p-th to q-th timings. The same goes for each of sensors 2 to "n". Among the MFP1 to the MFPm, each of the MFP1 to the MFPm-1 are normal when sensor data is acquired. The MFPm, however, is anomalous at the (p+1)-th to q-th timings though it is normal at the p-th timing.

Figure 6:
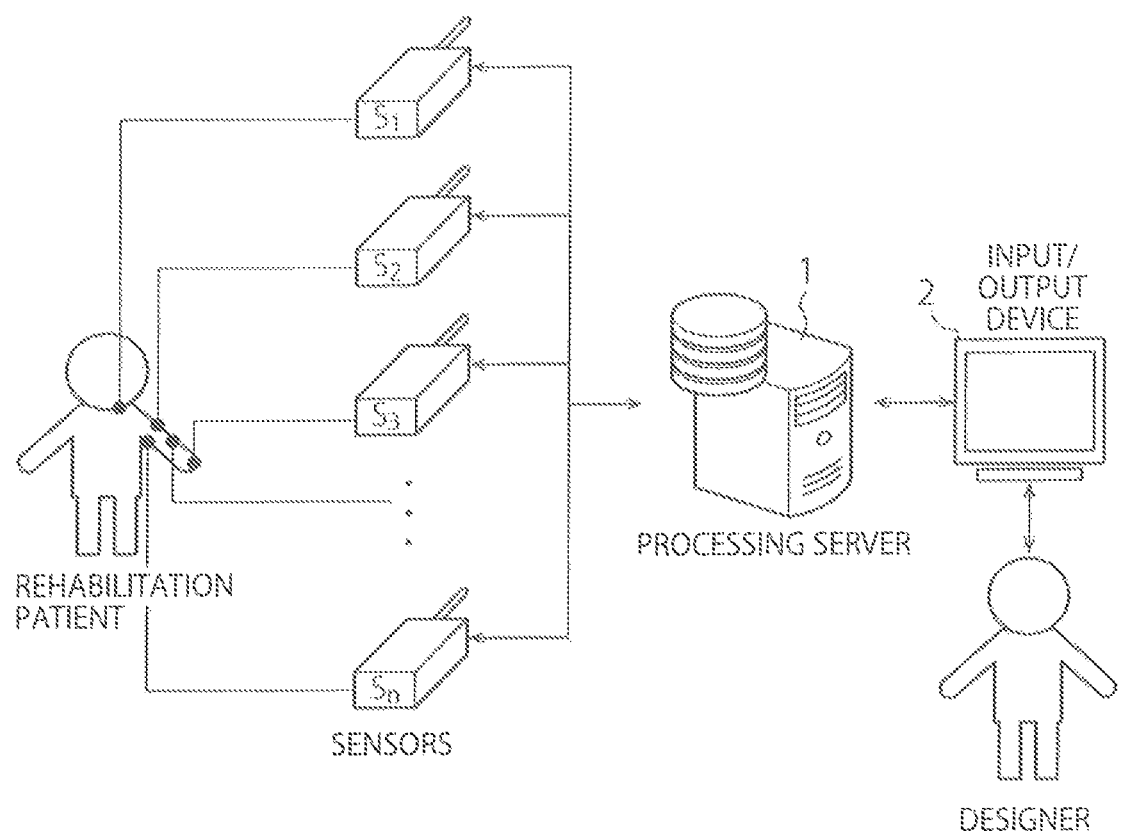
FIG. 6 is a diagram showing an example of sensor design in a home rehabilitation support system.

As described before, in the present embodiment, a monitoring target for which sensor design is to be performed may be a living body such as a person and an animal. FIG. 6 shows an example of sensor design in a home rehabilitation support system as an example in which a monitoring target is a person. The home rehabilitation support system is a system making it possible to, when a rehabilitation patient is at home, perform rehabilitation in a correct rehabilitation form even when a physical therapist/occupational therapist is absent. As a specific operation example, the home rehabilitation support system grasps a rehabilitation motion form of the rehabilitation patient by sensors, performs correctness judgment or motion classification, and presents results thereof to the rehabilitation patient.

In this system, sensor design with a high degree of freedom is required so that the home rehabilitation patient can perform in a state as natural as possible. It is desirable that, in order to secure the degree of freedom as high as possible the number of attached sensors is small, and the sensors are arranged at positions where the sensors are not annoying. Further, since a classification model for performing correctness judgment of a motion form at home is assumed to be mounted in a light PC environment such as a smartphone that the rehabilitation patient has, the classification model is required to be compact. The classification model is not limited to the correctness judgment of a motion form but may be a classification model for performing classification of a motion form.

Therefore, using sensor data of rehabilitation patients obtained by in-hospital rehabilitation as learning data, selection of sensors (selection of sensors to be attached to a rehabilitation patient) and construction of a classification model are performed by the present embodiment. By reducing the number of sensors and the number of pieces of data used for the classification model, a burden on the rehabilitation patient and the operation environment of the classification model can be reduced.

Further, as an application example of the above embodiment, it is possible to collect some people at the time of developing a home rehabilitation support system and perform the present invention. Thereby, even at the time of performing in-hospital rehabilitation, correctness judgment can be performed with a compact classification model on the basis of selected sensors and data acquired according to satisfaction of a selected condition. In this way, rehabilitation support is enabled.

Figure 7:
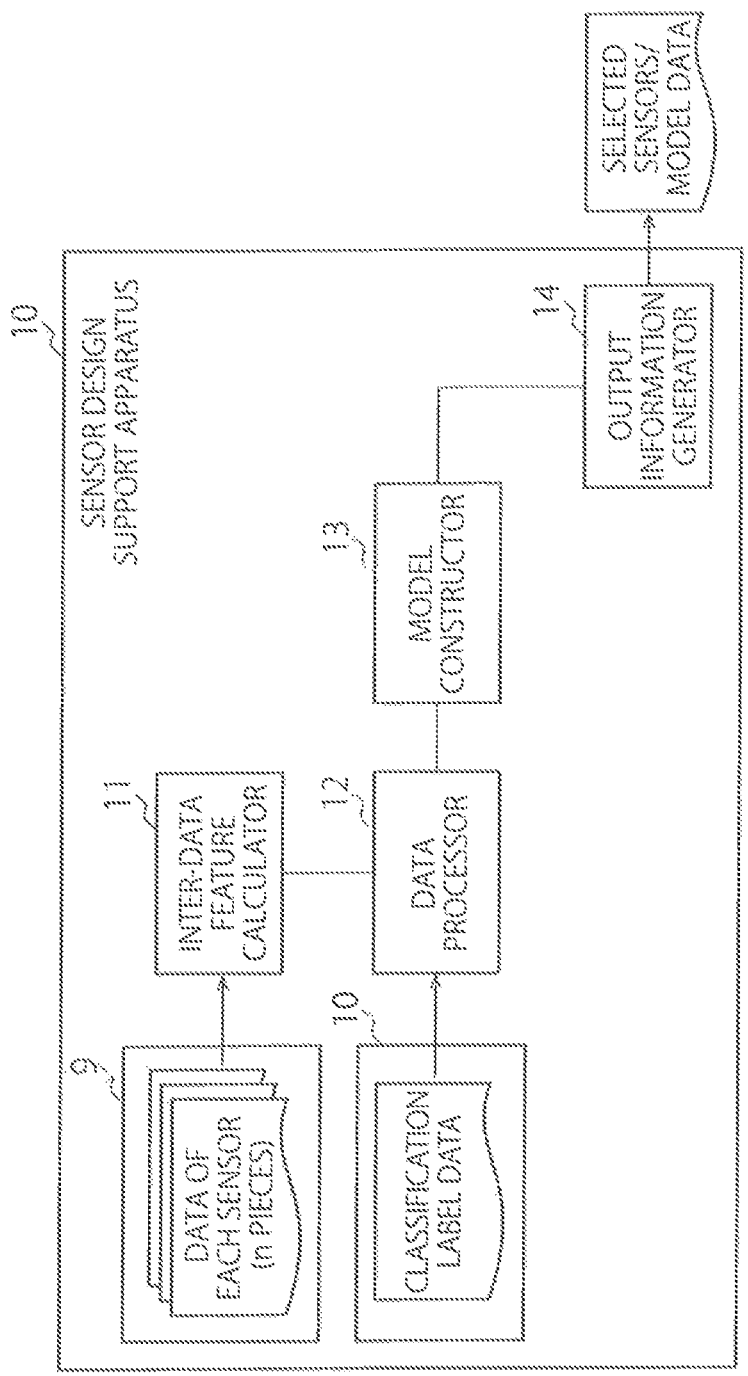
FIG. 7 is a functional block diagram of a sensor design support apparatus according to the first embodiment.

FIG. 7 is a functional block diagram of a sensor design support apparatus according to the embodiment of the present invention. The sensor design support apparatus includes a learning data holder 9, a classification label data holder 10, an inter-data feature calculator 11, a data processor 12, a model constructor 13 and an output information generator 14.

The sensor design support apparatus of the present embodiment constructs a classification model using sensor data acquired from each of "n" sensors when each of the first to k-th conditions is satisfied (hereinafter referred to as leaning data), and state data indicating a state of a monitoring target when each of the first to k-th conditions is satisfied. As an example, the state data includes a classification label of the state of the monitoring target. Specifically, a label indicating a normal class is included when the state of the monitoring target is normal, and a label indicating an anomalous class is included when the state is anomalous. At the time of constructing a classification model, the sensor design support apparatus performs selection of one or more sensors from among the "n" sensors and, at the same time, performs selection of conditions for acquiring sensor data from the selected sensors. Then, the sensor design support apparatus outputs information identifying the selected sensors, information identifying the selected conditions (the information corresponds to a representative data ID to be described later), data of the generated classification model (hereinafter, which is called classification model data) and the like.

(Learning Data of Sensors)

Figures 8, 9:
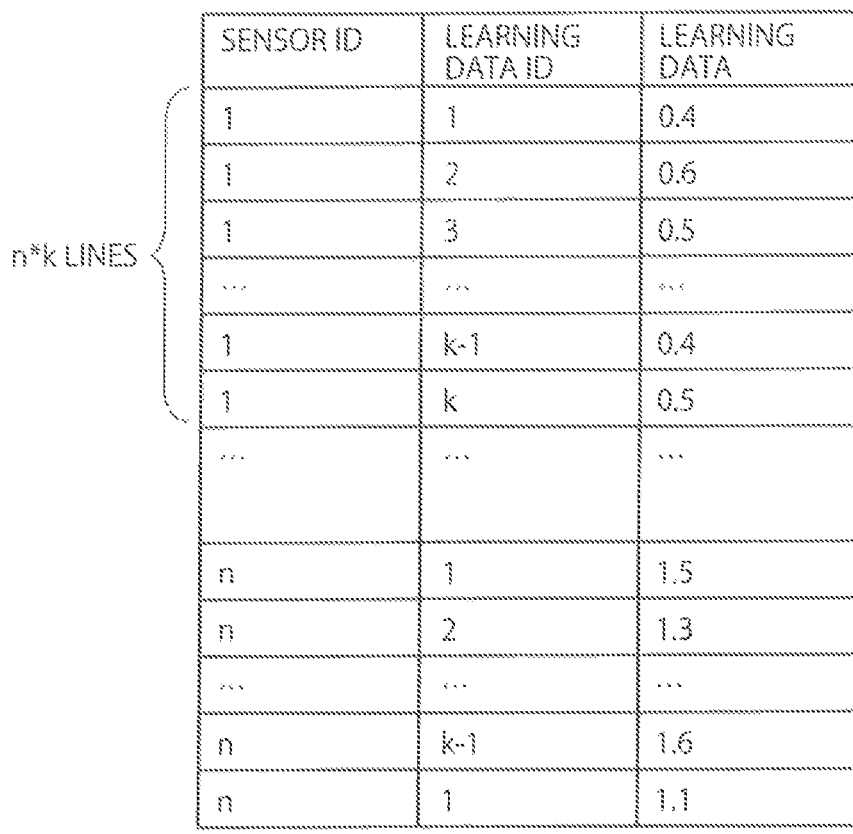
FIG. 8 is a diagram showing an example of a table that holds sensor data acquired from sensors.
FIG. 9 is a diagram showing another example of the table that holds the sensor data acquired from the sensors.

The learning data holder 9 holds a learning data table. FIG. 8 shows an example of the learning data table. For a sensor having the i-th sensor ID (a sensor "i"), "k" learning data values are held. The learning data values may be measured values of the sensors themselves or may be values obtained by performing statistical processing of the measured values. In addition, the learning data values may be arbitrary values calculated on the basis of the measured values. These values may be generically called as a sensor feature.

In the table of FIG. 8, "n*k" elements "$s_{i,j}$" ("i" and "j" refer to an ID of a sensor and an ID of learning data, respectively) are held. For example, an element "$s_{1,1}$" represents a value (=0.4) of learning data for "sensor ID=1" and "learning data ID=1".

A learning data ID is associated with each piece of learning data. A learning data ID corresponds to information identifying a condition under which corresponding learning data has been detected. For example, the "learning data ID=1" of each of the sensors 1 to "n" corresponds to the first condition.

Though learning data is one value in FIG. 8, the learning data may be a vector holding a plurality of time-series values (which corresponds to another example of the sensor features).

FIG. 9 shows another example of the learning data table. In this example, learning data is a vector holding a plurality of time-series values. This table holds "n*k*T" elements "$s_{i,j,t}$". Time "t" takes a value equal to or larger than 1 and equal to or smaller than "T", and "T" is a positive real number equal to or larger than 2. For example, "$s_{1,1,1}$" represents a sensor feature (=2.1) in the case of "sensor ID=1", "learning data ID=1" and "time t=1". Further, "$s_{1,1}$" represents "learning data (t=1, t=2, . . . , t=T)=(2.1, 7.4, 9.5, . . . , 6.9)" of "sensor ID=1" and "learning date ID=1".

If a sensor or time for which a sensor feature cannot be measured exists in the learning data table examples of FIGS. 8 and 9, an invalid value (such as "NA") can be stored in an appropriate cell in the table.

(Classification Label)

The classification label data holder 10 holds classification label data which is an example of state data. The classification label data holds a state (a class) of a monitoring target when a condition corresponding to each learning data ID is satisfied. The class is decided according to a target classification problem. Here, it is assumed that in a case of anomaly detection for classifying whether normal or anomalous, there are a normal class and an anomalous class.

FIG. 10 shows an example of the classification label data. Though the classification label data is configured as a table in this example, the classification label data may be in other configurations such as a list format. As classification labels, a label of "1" indicating the normal class or a label of "0" indicating the anomaly class is given to each learning data ID. When the classification label is unknown, an invalid value (such as "NA") can be stored in an appropriate cell. The classification label (a label of the normal class or the anomalous class) may be given by a designer or other persons or may be acquired from a log of a product such as an MFP.

The learning data table and the classification label data may be inputted from the input/output device 2 and stored into the learning data holder 9 and the classification label data holder 10, respectively, by the designer. Otherwise, the sensor design support apparatus may receive the table and the data from an external apparatus via a communication network and store the table and the data into the learning data holder 9 and the classification label data holder 10.

(Inter-Data Feature Calculator 11)

The inter-data feature calculator 11 reads pieces of learning data 1 to "k" of each sensor from the learning data table. The inter-data feature calculator 11 generates a plurality of data pairs by combining any two elements of the pieces of learning data 1 to "k" for each sensor and calculates a feature between the pieces of learning data (hereinafter referred to as an inter-data feature) for each data pair. Then, the generated inter-data feature is stored into an appropriate cell of a matrix having "k" lines and "k" columns to generate a table (an inter-data feature table). The inter-data feature table is generated for each sensor.

For example, an inter-data feature "$x_{j,r}$" between the j-th learning data "$S_{i,j}$" of the sensor "i" and the r-th learning data "$S_{i,r}$" of the sensor "i" is calculated by the following formula.

[Formula 1]

$$x_{j,r} = \text{Dis}(S_{i,j}, S_{i,r}) \quad (1)$$

The "Dis" function in Formula (1) is a function to calculate a distance between two pieces of learning data. Learning data may be a single value or time-series data as described before. In the case where the two pieces of learning data are a single value, a function to perform addition, subtraction, multiplication or division between the two pieces of learning data is conceivable. In the case where the two pieces of learning data are time-series data, a function to calculate a correlation coefficient showing a degree of similarity between the two pieces of time-series data, or "Dynamic time warping" which is a distance function between pieces of time-series data in consideration of nonlinear distortion, or "Shaplet" which is a distance function capable of considering a partial time-series, and the like are conceivable.

When "j" and "r" are equal (that is, in the case of a self-mutual inter-data feature), the inter-data feature "$x_{j,r}$" is set to 0. Further, when a value of at least one piece of learning data of a data pair is an invalid value ("NA") or when the value of the learning data is an unreliable value also, the inter-data feature is set to 0.

FIG. 11 shows an example of the inter-data feature table of each sensor. Inter-data features calculated from the data pairs are stored in cells of the inter-data feature table. As described above, an inter-data feature between the same pieces of learning data is 0.

The inter-data feature is indicated by "$x_{j,r}$ (j=1, . . . , k; r=1, . . . , k)". For example, "$x_{1,2}$" represents an inter-data feature between the learning data 1 (learning data of "learning data ID=1") and the learning data 2 (learning data of "learning data ID=2"). Examples of the inter-data feature include a degree of similarity or a difference between the two pieces of learning data. For example, when the inter-data feature is a difference, "$x_{1,2}$" is a value obtained by subtracting a value of the learning data 2 from a value of the learning data 1, and "$x_{2,1}$" is a value obtained by subtracting the value of the learning data 1 from the value of the learning data 2.

The inter-data feature calculator 11 provides the inter-data feature table of each sensor to the data processor 12.

(Data Processor 12)

The data processor 12 receives the inter-data feature table of each sensor "i" from the inter-data feature calculator 11. Further, the data processor 12 acquires the classification label data from the classification label data holder 10.

The data processor 12 performs preprocessing of the classification label data, for the subsequent-stage model constructor 13. Further, the data processor 12 performs a process for combining the inter-data feature tables of the sensors 1 to "n". As the preprocessing, a binarization process may be performed when a classification label is not binarized. In addition, signal processing such as low-pass filter processing may be performed. Classification labels shown in FIG. 10 are binarized.

In the inter-data feature table combination process, an explanatory variable table is generated by combining the inter-data feature tables of all the sensors in a line direction. When the combination process is performed for the inter-data feature tables shown in FIG. 11, a generated explanatory variable table is a table with "n*k" columns and "k" lines. For each column of the explanatory variable table, normalization may be performed so that an average of 0 and a distribution of 1 are obtained in a column direction. Otherwise, for each line, normalization may be performed so that an average of 0 and a distribution of 1 are obtained in the line direction.

FIG. 12 shows an example of the process for combining the inter-data feature tables of the sensors. For example, in a column of "(sensor ID, learning data ID)=(1,1)", an inter-data feature (=0) between the learning data 1 and the learning data 1, an inter-data feature between the learning data 2 and the learning data 1, an inter-data feature between the learning data 3 and the learning data 1, and an inter-data feature between the learning data "k" and the learning data 1 are stored for the sensor 1. In a column of "(sensor ID, learning data ID)=(2, k)", an inter-data feature between the learning data 1 and the learning data 2, an inter-data feature (=0) between the learning data 2 and the learning data 2, an inter-data feature between the learning data 3 and the learning data 2, . . . , and an inter-data feature between the learning data "k" and the learning data 2 are stored for the sensor 2. An inter-data feature between learning data "j" and learning data "r" for the sensor "n" may be represented by "$x_{n,j,r}$".

The method for creating the explanatory variable table is not limited to the above example. As another method, learning data to be combined with the pieces of learning data 1 to "k" of each line (the pieces of learning data 1 to "k" of each column) may be limited to only learning data having a predetermined label (for example, the normality class label) for each sensor. In other words, only columns of learning data having a predetermined label (for example, the normality class label) among the plurality of columns of the explanatory variable table in FIG. 12 described above may be selected to create an explanatory variable table.

For example, when it is assumed that pieces of learning data having a predetermined label (the normality class label) among the pieces of learning data 1 to "k" are pieces of learning data 1 to "p", and pieces of learning data having other labels (the anomaly class label) are pieces of learning data "p+1" to "k", the explanatory variable table has "n*p" columns. Therefore, this explanatory variable table is more compact than the explanatory variable table having "n*k" columns and "k" lines described above.

When an invalid value (such as "NA") is included as a classification label, an inter-data feature calculated between learning data and the learning data to which the invalid value is given may be deleted from the table. When an SVM is used as a classification model, this deletion process may be skipped as necessary.

The data processor 12 associates the generated explanatory variable table with the classification label data via the learning data IDs and provides the classification label data and the explanatory variable table which are mutually associated, to the model constructor 13.

(Model Constructor 13)

The model constructor 13 constructs a classification model on the basis of the explanatory variable table and classification label data received from the data processor 12. In the construction of the classification model, selection of sensors to be used from among the plurality of sensors 1 to "n" and selection of a condition(s) from among the first to k-th conditions for each of the selected sensors are performed. Specifically, the selection of a condition to be applied to each of the selected sensors is performed by selecting learning data from among the pieces of learning data 1 to "k" and selecting a condition corresponding to a learning data ID of the selected learning data (representative data). The model constructor 13 provides sensor IDs of the selected sensors (selected sensor IDs), the ID of the selected learning data (the representative data) and the constructed classification model to the output information generator 14.

The ID of the selected learning data (the representative data) may be referred to as a representative data ID.

Hereinafter, an example will be shown in which the model constructor 13 generates a logistic regression model as a classification model. Models other than the logistic regression model, for example, an SVM can be generated as a classification model.

The logistic regression model is a regression model in accordance with the following formula:

[Formula 2]

$$P(y=1 \mid X) = logit(z) = \frac{1}{1+e^z} \quad (2)$$

$$z = \sum_{i=1}^{n} \sum_{j=1}^{k} \sum_{r=1}^{k} \beta_{i,j,r} x_{i,j,r} + \beta_0$$

Here, "logit" represents a logistic function; "logit(z)" has a value range larger than 0 and smaller than 1; and "$\beta_0$" represents an intercept.

Here, "$x_{i,j,r}$" represents an inter-data feature between the j-th learning data and the r-th learning data for the i-th sensor (corresponding to an inter-data feature of a cell at which the j-th line and the r-th column cross each other in the inter-data feature table of the i-th sensor).

Here, "$\beta_{i,j,r}$" is a regression coefficient for the inter-data feature "$x_{i,j,r}$". Here, regression coefficients for one sensor "i" will be collectively written as "$\beta_i=\{\beta_{i,1,1}, \beta_{i,1,2}, \ldots, \beta_{i,k,k}\}$". Further, "$\beta_i$" for all the sensors will be collectively written as "$\beta=\{\beta_1, \beta_2, \ldots, \beta_n\}$".

Here, "z" is a value obtained by integrating the regression coefficient "$\beta_{i,j,r}$" and the inter-data feature "$x_{i,j,r}$". For example, "z" is a value obtained by performing weighted addition of a plurality of inter-data features "$x_{i,j,r}$", like any one line in the explanatory variable table, with a plurality of regression coefficients "$\beta_{i,j,r}$". As a modification, a formula which does not include "$\beta_0$" may be used as a formula for "z".

Here, "X" is a vector which includes inter-data features "$x_{i,j,r}$" (i=1 to n, r=1 to k) about the j-th learning data of the "n" sensors. The number of elements of the vector is "n*k". That is, "X" corresponds to any one line of the explanatory variable table. Further, "P(y=1|X)" (that is, the value of "logit(z)") represents a probability of a classification label (here, the normality class label) being 1 when the vector X is given. Here, "P(y=1|X)" has a value larger than 0 and smaller than 1.

In the case of deciding a classification label using the classification model described above, a judgment using a threshold "C" can be adopted as an example. For example, if the value of the function "logit(z)" (the probability of being 1) is above the threshold C, 1 is given as a classification label, and 0 is given as a classification label if the value is equal to or below the threshold "C".

classification label: 1 logit(z)>C classification label: 0 logit(z)<=C      [Formula 3]

To construct a classification model is equivalent to determine "$\beta=\{\beta_1, \beta_2, \ldots, \beta_n\}=\{\beta_{1,1,1}, \beta_{1,1,2}, \ldots, \beta_{1,k,k}, \beta_{2,1,1}, \beta_{2,1,2}, \ldots, \beta_{2,k,k}, \ldots, \beta_{n,1,1}, \beta_{n,1,2}, \ldots, \beta_{n,k,k}\}$", which is a regression coefficient in Formula (2) and "$\beta_0$" when the type of the model is decided like Formula (2). If all of "$\beta_{i,j,r}$" are 0 for "j=1 to k" and "r=1 to k", it means that the sensor "i" is not used (does not have to be selected). Further, if all of "$\beta_{i,s,r}$" are 0 for "r=1 to k" in the case of "j=s", and all of "$\beta_{i,j,s}$" are 0 for "j=1 to k" in the case of "r=s", it means that learning data "s" is unnecessary. That is, it means that, when a condition corresponding to the ID of the learning data "s" is satisfied, it is not necessary to acquire sensor data (it is not necessary to select the condition).

Here, "$\beta=\{\beta_1, \beta_2, \ldots, \beta_n\}$" and "$\beta_0$" can be determined, for example, using a maximum likelihood estimation method or a least squares method. In this case, in order to prevent over-learning, an estimation method which includes regularization and which is capable of simultaneously performing selection of variables and construction of a classification model is used. Specifically, "Lasso" or "Elastic Net" is used. Since "Lasso" is a kind of "Elastic Net", an example of using "Elastic Net" will be shown here.

In "Elastic Net", at the time of determining "$\beta$" and "$\beta_0$" by the least squares method, Formula (3) of a minimization problem of a loss function "J" is solved using a penalty term "$\lambda E(\beta)$". Formula (3) is a concave function. The penalty term is shown by Formula (4). The loss function "J" is a sum of square errors between a true value "$y_j$" of an objective variable and an estimated value (a value of logit) "$\hat{y}_j$" calculated by a logistic regression function having "$\beta$" and "$\beta_0$" as shown by Formula (5). Formula (5) represents a quantification value of a difference between a value of a classification label (the true value "$y_j$") and an output value of a classification model (the value of "logit"). Formula (3) is an example of a function of minimizing a value based on Formula (5).

[Formula 4]

$$\arg\min(J+\lambda E(\beta)) \quad (3)$$

$$\lambda E(\beta) = \lambda((1-\alpha)\Sigma_{i=1}^{n}\Sigma_{j=1}^{k}\Sigma_{r=1}^{k}\|\beta_{i,j,r}\|^2 + \alpha\Sigma_{i=1}^{n}\Sigma_{j=1}^{k}\Sigma_{r=1}^{k}\|\beta_{i,j,r}\|) \quad (4)$$

$$J = \Sigma_{j=1}^{k}\|y_j - \hat{y}_j\|^2 \quad (5)$$

Here, "$\lambda$" is a parameter to decide strength of a penalty term, and "$\lambda$" can be decided in arbitrary method. As an example, a cross validation method can be used. For example, the explanatory variable table is divided along the line direction (a horizontal direction along the page) to generate a plurality of partial tables, and an optimal "$\lambda$" is decided from the plurality of partial tables by the cross validation method. The number of divisions is generally about 10 to 100. For example, on the assumption of "k=200", ten partial tables of "k=1 to 20, 21 to 40, ..., 191 to 200" are obtained by division into ten. By constructing a classification model using the second to tenth partial tables as training cases and performing evaluation (such as accuracy evaluation) of the classification model using the first partial table as a test case, "$\lambda$" satisfying a predetermined criterion (for example, such "$\lambda$" that an identification rate is the highest). This is repeated until each partial table has been used as a test case once. An optimal "$\lambda$" is decided from among the decided "$\lambda$"s. For example, "$\lambda$" with the highest identification rate is adopted. The specific example of the cross validation method is a mere example, and there are other various specific examples.

Here, "$\alpha$" is a parameter that adjusts strengths of the first and second terms of Formula (4). In "Elastic Net", the range is "$0<\alpha<1$". In the case of "Lasso", "$\alpha=1$" is assumed. Though the value of the parameter is arbitrary, for example, "$\alpha=0.5$" is assumed.

As for regularization including "Elastic Net" or "Lasso", see Regularization and variable selection via the elastic net [Zou, Hui; Hastie, Trevor 2005].

Among the elements of the regression coefficient "$\beta$" determined in this way ($\beta_{i,j,r}$: i=1 to n, j=1 to k, r=1 to k), nonzero elements and zero elements exist.

If at least one element is nonzero in "$\beta_i(\beta_{i,1,1}, \beta_{i,1,2}, \ldots, \beta_{i,k,k})$", the model constructor 13 selects the sensor "i". In other words, if all of "$\beta_{i,1,1}, \beta_{i,1,2}, \ldots, \beta_{i,k,k}$" are zero, the model constructor 13 does not select the sensor "i".

Further, for "$\beta_{i,j,r}$" which are nonzero, each of the learning data "j" and the learning data "r" for the sensor "i" is selected as representative data. In other words, if all of "$\beta_{i,s,r}$" are zero for "r=1 to k" in the case of "j=s", and all of "$\beta_{i,j,s}$" are zero for "j=1 to k" in the case of "r=s", the learning data "s" is not selected for the sensor "i".

Though whether selection of sensors and learning data is possible or not is judged on the basis of whether nonzero or not here, whether the selection is possible or not may be judged on the basis of whether being larger than a threshold or not as a modification. In this case, if at least one element is larger than the threshold in "$\beta_i(\beta_{i,1,1}, \beta_{i,1,2}, \ldots, \beta_{i,k,k})$", the model constructor 13 selects the sensor "i". In other words, if all of "$\beta_{i,1,1}, \beta_{i,1,2}, \ldots, \beta_{i,k,k}$" are below the threshold, the model constructor 13 does not select the sensor "i".

Further, for "$\beta_{i,j,r}$" which are larger than the threshold, each of the learning data "j" and the learning data "r" for the sensor "i" is selected as representative data. In other words, all of "$\beta_{i,s,r}$" are below the threshold for "r=1 to k" in the case of "j=s", and all of "$\beta_{i,j,s}$" are below the threshold for "j=1 to k" in the case of "r=s", the learning data "s" is not selected for the sensor "i".

Figure 13:
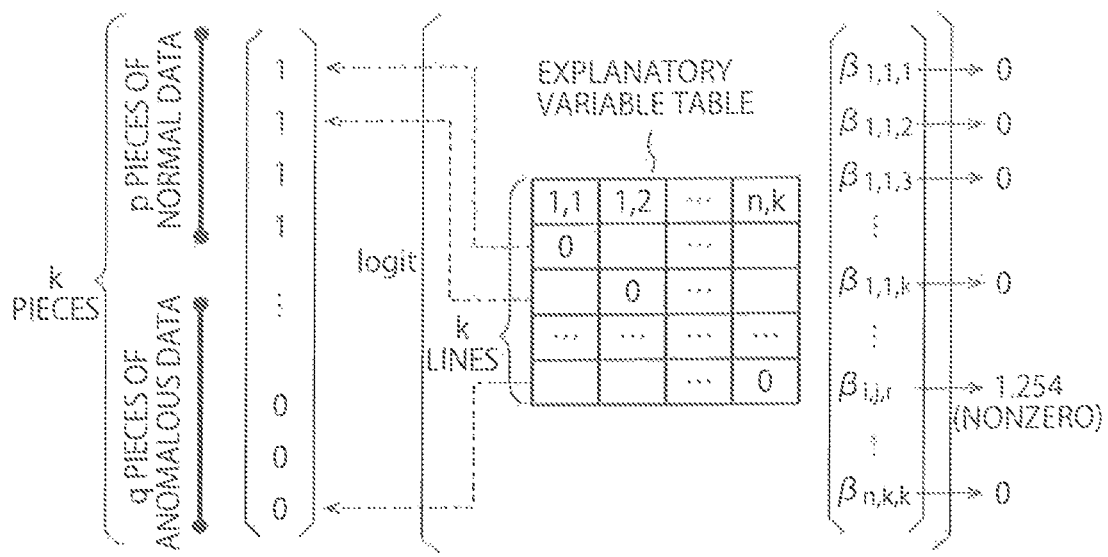
FIG. 13 is a diagram showing an operation image of a classification model construction process.

FIG. 13 shows an operation image of the classification model construction process. On the left side of FIG. 13, classification labels corresponding to "learning data IDs=1 to k" are shown as classification label data. When conditions corresponding to "k=1 to p" are satisfied, the MFP is normal (the classification labels each is 1). When conditions corresponding to "k=p+1 to q" are satisfied, the MFP is anomalous (the classification labels each is 0). Regarding the values of the classification labels as true values, classification model construction is performed.

In the parentheses of "logit" in FIG. 3, an explanatory variable table and "vector $\beta=(\beta_{1,1,1}, \beta_{1,1,2}, \beta_{1,1,3}, \ldots, \beta_{i,j,r}, \ldots, \beta_{n,k,k})^T$" are shown. This schematically expresses that a vector that stores values of each line of the explanatory variable table, "$\{x_{1,1,1}, x_{1,1,2}, x_{1,1,3}, \ldots, x_{i,j,r}, \ldots, x_{n,k,k}\}$" is multiplied by the "vector $\beta=\{\beta_{1,1,1}, \beta_{1,1,2}, \beta_{1,1,3}, \ldots, \beta_{i,j,r}, \ldots, \beta_{n,k,k}\}$", that is, the formula for "z" of Formula (2).

It is shown by a broken line arrow that, when the learning data 1 of each sensor corresponding to the first line of the explanatory variable table is acquired, the MFP is normal, that is, the classification label is 1. Similarly, it is shown by a broken line arrow that, when the learning data "k" of each sensor corresponding to the k-th line of the explanatory variable table is acquired, the MFP is anomalous, that is, the classification label is 0.

Since each element of "$\beta_1$" becomes zero, that is, all of "$\beta_{1,1,1}, \beta_{1,1,2}, \beta_{1,1,3}, \ldots, \beta_{1,1,k}$" become zero by the classification model construction process, the sensor 1 is not selected (definitely, any of the pieces of learning data 1 to "k" of the sensor 1 is not selected as representative data). Since "$\beta_{i,j,r}$" is nonzero, the sensor "i" is selected, and at least the learning data "j" and the learning data "r", among the pieces of learning data 1 to "k" of the sensor "i", are selected as representative data. Though "$\beta_{n,k,k}$" is zero, the sensor "n" is selected if at least one element other than "$\beta_{n,k,k}$", among elements of "$\beta_n$", that is, "$\{\beta_{n,1,1}, \beta_{n,1,2},$ $\beta_{n,1,3}, \ldots, \beta_{n,k,k}\}$" is nonzero. Each of pairs of learning data corresponding to the nonzero elements is selected as representative data.

The model constructor 13 provides a classification model which includes regression coefficients which are nonzero and does not include regression coefficients which are zero, to the output information generator 14. The model constructor 13 also provides a sensor IDs of selected sensors (selected sensor IDs), and learning data IDs of pieces of representative data of the selected sensors (representative data IDs) to the output information generator 14.

The classification model provided to the output information generator 14 includes data showing definition (i.e., format) of the function shown in Formula (2) or information identifying the definition, and values of the regression coefficients which are nonzero. When the definition of the function is decided in advance, a configuration is also possible in which the data showing the definition of the function or the information identifying the definition is not provided. Further, in addition to the values of the regression coefficients which are nonzero, values of the regression coefficients which are zero may be provided to the output information generator 14. That is, values of all the regression coefficients included in Formula (2) may be provided.

Figure 14:
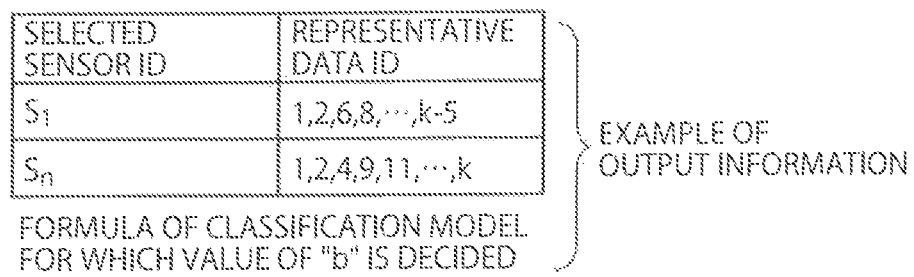
FIG. 14 is a diagram showing an example of output information.

The output information generator 14 generates information required to be presented to a user as output information on the basis of the classification model, the selected sensor IDs, and the representative data IDs received from the model constructor 13. The output information generator 14 provides the generated output information to the input/output device 2. The input/output device 2 displays the output information received from the output information generator 14 on a screen. FIG. 14 shows example of the output information. As an example, the output information includes data indicating the classification model (including the definition of the function and the values of the regression coefficients), the selected sensor IDs and the representative data IDs. The output information may include other information such as information indicating the number of pieces of representative data for each sensor. The destination to which the output information is provided is not limited to the input/output device 2. For example, the output information generator 14 may transmit the output information to an external communication device using a wireless or wired communication interface.

The designer who is the user confirms content of the output information, that is, the selected sensor IDs, the representative data IDs and the classification model via the screen of the input/output device 2 or the like. If the designer accepts the content, he may decide to install the sensors of the selected sensor IDs on the MFP, as an example. Further, when the sensors of the selected sensor IDs are actually installed on the MFP, operation of a device which collects sensor data may be controlled so as to collect the sensor data from the sensors mounted on the MFP only when conditions corresponding to the representative data IDs are satisfied. Further, a device in which the classification model is incorporated may be prepared, and operation of the device may be set so as to detect anomaly from collected sensor data.

Instead of Formula (4) of the penalty term described above, Formula (6) below may be used.

[Formula 5]

$$\lambda E(\beta) = \lambda \left( (1-\alpha) \sum_{i=1}^{n} \sum_{j=1}^{k} \sum_{r=1}^{k} \|\beta_{i,j,r}\|^2 + \alpha \sum_{i=1}^{n} \sum_{j=1}^{k} \sum_{r=1}^{k} \frac{1}{\|N_i\|} \|\beta_{i,j,r}\| \right) \quad (6)$$

Formula (6) is obtained by adding "$1/\|Ni\|$" on the right side of Formula (4). Here, "Ni" corresponds to the sensor "i"; the range of "i" is from 1 to "n"; and "$1/\|Ni\|$" is a constant. A value of "Ni" is given to advance for each sensor. It is assumed that "Ni" is a natural number larger than 0. The designer sets the value of "Ni" larger for a sensor with a higher priority (that is, a sensor the designer wants to select more) among the sensors 1 to "n". Thereby, for the sensor the designer wants to select more, the value of a term that includes "$1/\|Ni\|$" is smaller, and the value of the penalty term is smaller. For example, the value of "Ni" is set larger for a sensor for which cost (installation cost and the like) to be described later is lower.

Though an explanatory variable table is generated by combining inter-data feature tables in the embodiment described above, a configuration is also possible in which this process is not performed. In this case, the data processor 12 can associate classification label data with the inter-data feature table of each sensor, and the model constructor 13 can perform the process described above using the associated inter-data feature table.

(Modification 1)

In the present embodiment, two states of normality and anomaly are used as states of a monitoring target (MFP). However, the number of states may be three or more. In this case, a multinomial logistic regression model or a multi-class SVM can be used as a classification model. Thereby, it is possible to judge which of the three or more states the monitoring target is in.

(Modification 2)

In the case of three or more states as states of a monitoring target, a method is also possible in which a plurality of binary problem classification models are created. A specific example will be shown below. A case is assumed where there are three states A, B and C as states of a monitoring target.

In this case, a classification model A for classifying the state A and a state other than the state A (that is, the state B or C), a classification model B for classifying the state B and a state other than the state B (that is, the state A or C), and a classification model C for classifying the state C and a state other than the state C (that is, the state A or B) are generated in accordance with the embodiment described above.

At the time of actual judgment, any of the states A, B and C is decided by combining judgments using the classification models A, B and C.

For example, if the state A, the state other than the state B and the state other than the state C are decided for the classification model A, B and C, respectively, the results are integrated, and the state A is decided in the end by majority vote or the like.

Otherwise, if the state A, the state other than the state B and the state C are decided for the classification models A, B and C, respectively, a probability of the state A calculated from the classification model A and a probability of the state C calculated from the classification model C is compared, and a state corresponding to a probability with a larger value may be decided in the end.

Figure 15:
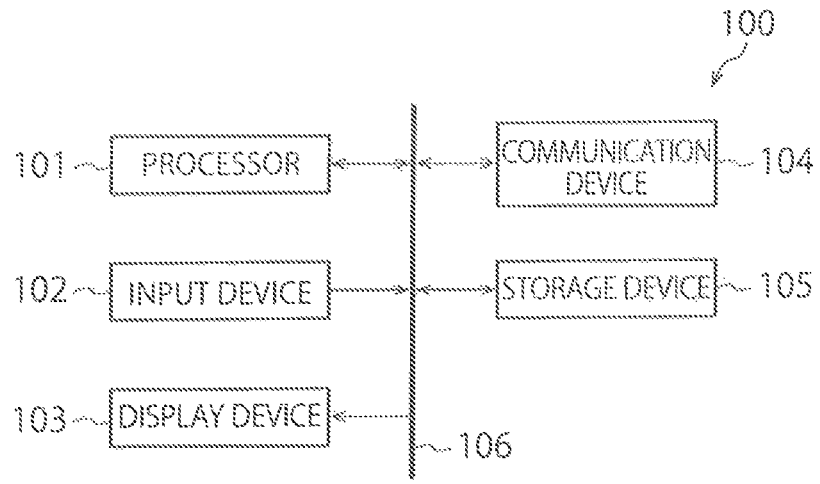
FIG. 15 is a diagram showing a hardware configuration of a processing server according to the first embodiment.

A hardware configuration of the processing server 1 according to the present embodiment will be described with reference to FIG. 15. In this example, the processing server 1 and the input/output device 2 shown in FIG. 1 are integrally configured. The processing server 1 according to the present embodiment is configured with a computer 100. As the computer 100, a server, a client, a microcomputer, a general-purpose computer and the like are included. FIG. 15 is a diagram showing an example of the computer 100.

The computer 100 in FIG. 15 is provided with a processor (a central processing unit) 101, an input device 102, a display device 103, a communication device 104 and a storage device 105. The processor 101, the input device 102, the display device 103, the communication device 104 and the storage device 105 are mutually connected via a bus 106.

The processor 101 is an electronic circuit which includes a control device and an arithmetic operation device of the computer 100. As the processor 101, for example, a general-purpose processor, a central processing unit (CPU), a microprocessor, a digital signal processor (DSP), a controller, a microcontroller, a state machine, an application specific integrated circuit, a field programmable gate array (FPGA), a programmable logic circuit (PLC) and a combination thereof can be used.

The processor 101 performs arithmetic operation processing on the basis of data inputted from each device connected via the bus 106 (for example, the input device 102, the communication device 104 or the storage device 105) or a program and outputs an arithmetic operation result or a control signal to each device connected via the bus 106 (for example, the display device 103, the communication device 104 or the storage device 105). Specifically, the processor 101 executes an OS (Operating System) of the computer 100 or a sensor design support program to control each of the devices constituting the computer 100.

The sensor design support program is a program that causes the computer 100 to realize each functional component of the processing server 1 described above. The sensor design support program is stored in a non-transitory, tangible computer-readable storage medium. The above storage medium is, for example, an optical disk, a magneto-optical disk, a magnetic disk, a magnetic tape, a flash memory or a semiconductor memory but is not limited thereto. By the processor 101 executing the sensor design support program, the computer 100 functions as the sensor design support apparatus.

The input device 102 is a device for inputting information to the computer 100. The input device 102 is, for example, a keyboard, a mouse or a touch panel but is not limited thereto. The user can make various settings by using the input device 102.

The display device 103 is a device for displaying an image or movie. The display device 103 is, for example, an LCD (Liquid Crystal Display), a CRT (Cathode-Ray Tube) or a PDF (Plasma Display) but is not limited thereto. The display device 103 displays GUI or CUI. Further, the display device 103 may display various kinds of data stored in the storage device 105 or output information outputted by the output information generator 14. Further, the display device 103 may display integrated information (see FIGS. 22 and 24) outputted by an information integrator 16 to be described later.

The communication device 104 is a device for the computer 100 to wirelessly or wiredly communicate with an external apparatus. The communication device 104 is, for example, a modem, a hub or a router but is not limited thereto. Data of sensors may be inputted from an external apparatus via the communication device 104 and stored into the storage device 105.

The storage device 105 is a hardware storage medium that stores the OS of the computer 100, the sensor design support program, data required for execution of the sensor design support program, data generated by execution of the sensor design support program and the like. The storage device 105 includes a main memory and an external storage device. The main memory is, for example, a RAM, a DRAM or an SRAM but is not limited thereto. Further, the external storage device is, for example, a hard disk, an optical disk, a flash memory or a magnetic tape but is not limited thereto.

The computer 100 may be provided with one or more processors 101, input devices 102, display devices 103, communication devices 104 and storage devices 105, and peripheral equipment such as a printer and a scanner may be connected to the computer 100.

Further, the processing server 1 may be configured with a single computer 100 or may be configured as a system constituted by a plurality of computers 100 that are mutually connected.

Furthermore, the sensor design support program may be stored in the storage device 105 of the computer 100 in advance, or may be stored in an external storage medium outside the computer 100 or may be uploaded on the Internet. In any case, by installing and executing the sensor design support program on the computer 100, the functions of the processing server 1 are realized.

Figure 16:
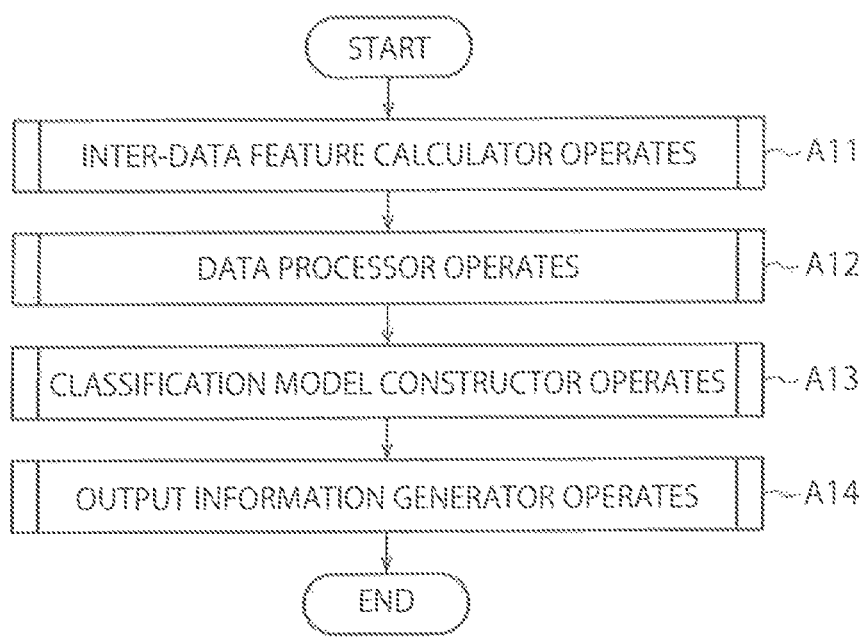
FIG. 16 is a flowchart of overall operation of the processing server according to the first embodiment.

FIG. 16 is a flowchart of overall operation of the processing server 1 that executes a sensor design support method according to the embodiment of the present invention.

Figure 17:
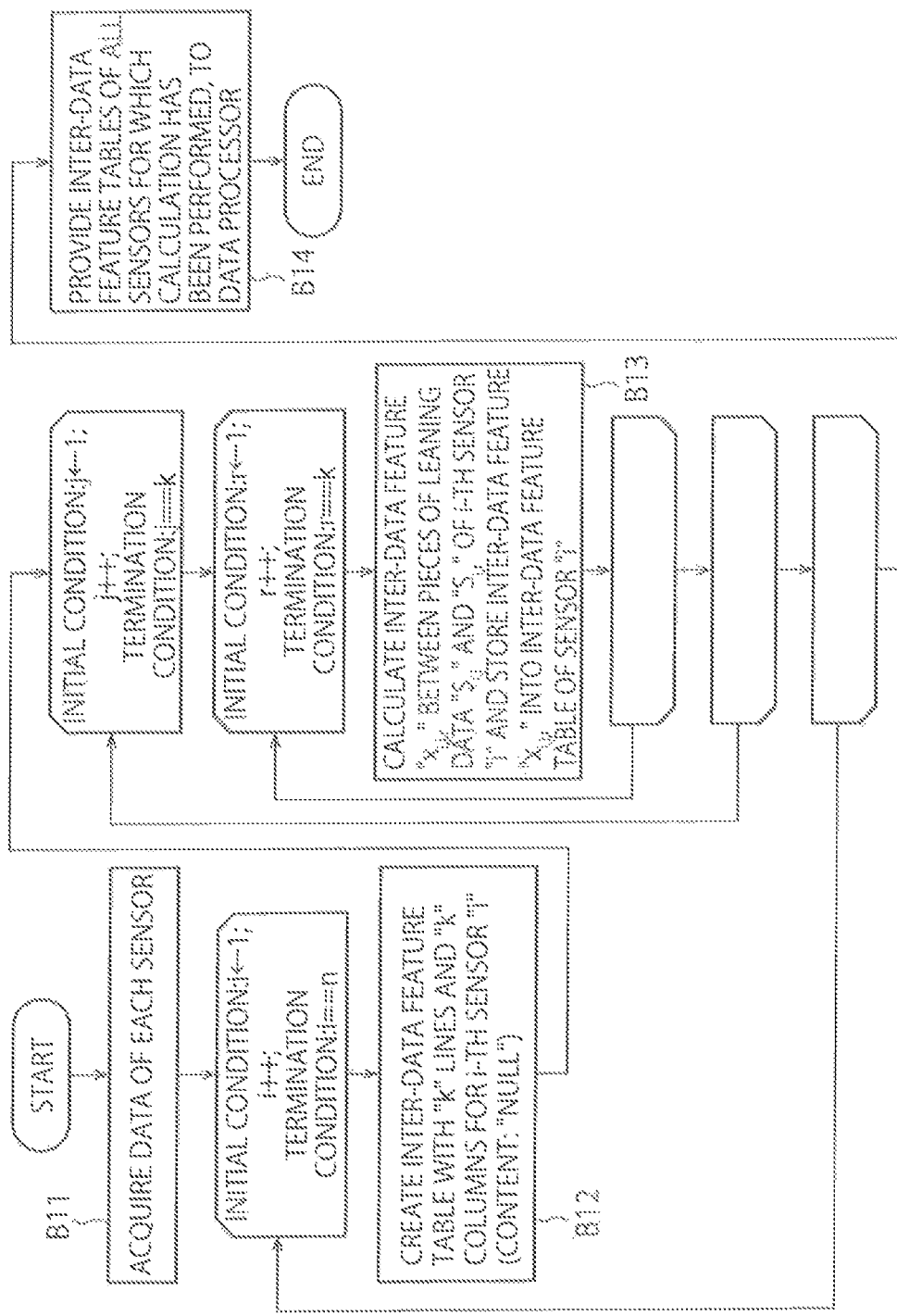
FIG. 17 is a diagram showing a detailed operation flow of an inter-data feature calculator.

The inter-data feature calculator 11 creates an inter-data feature table for each sensor (A11). FIG. 17 shows a detailed operation flow of the inter-data feature calculator 11. First, the inter-data feature calculator 11 acquires sensor data (learning data) 1 to "k" from each of the "n" sensors from a learning data table (B11). Then, the inter-data feature calculator 11 creates an inter-data feature table which has "k" lines and "k" columns and in which an initial value of each cell is set to Null for each sensor (B12). The inter-data feature table is a matrix having "k" lines and "k" columns, and each element of the matrix is "Null" at this point of time. An inter-data feature between the j-th learning data "$S_{i,j}$" and r-th learning data "$S_{i,r}$" of the sensor "i" is calculated, and the calculated inter-data feature is stored into an appropriate cell of the inter-data feature table (B13). On the assumption of "j=1 to k" and "r=1 to r", an inter-data feature is calculated for all learning data pairs, and the inter-data features are stored into appropriate cells. Thereby, the inter-data feature table for the sensor "i" is completed. This is performed for all the sensors (by sequentially changing "i" from 1 to "n"), and an inter-data feature table is generated for each of all the sensors. The generated plurality of inter-data feature tables of all the sensors are provided to the data processor 12 (B14).

Figure 18:
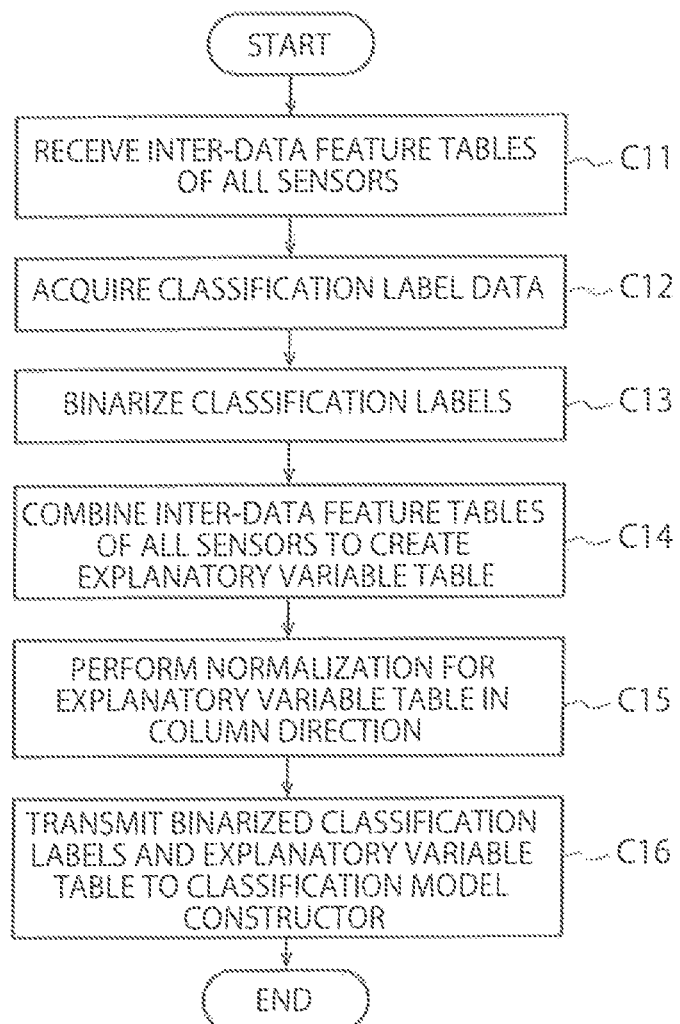
FIG. 18 is a diagram showing a detailed operation flow of a data processor.

Next, the data processor 12 operates (A12 in FIG. 16). FIG. 18 shows a detailed operation flow of the data processor 12. The inter-data feature tables of all the sensors are received from the inter-data feature calculator 11 (C11), and classification label data is acquired from the classification label data holder 10 (C12). If each classification label included in the classification label data is not binarized, the classification label is binarized (C13). That is, each classification label is converted to 1 or 0. As an example, a value equal to or above a threshold is converted to 1, and a value below the threshold is converted to 0. By combining the inter-data feature tables of all the sensors in a line direction, an explanatory variable table is created (C14). Normalization of the explanatory variable table is performed in a column direction (or in the line direction) (C15). For example, normalization is performed so that, for each column, average 0 and dispersion 1 is realized for values of a cell group belonging to the column. The classification label data and the explanatory variable table are provided to the model constructor 13 (C16).

Figure 19:
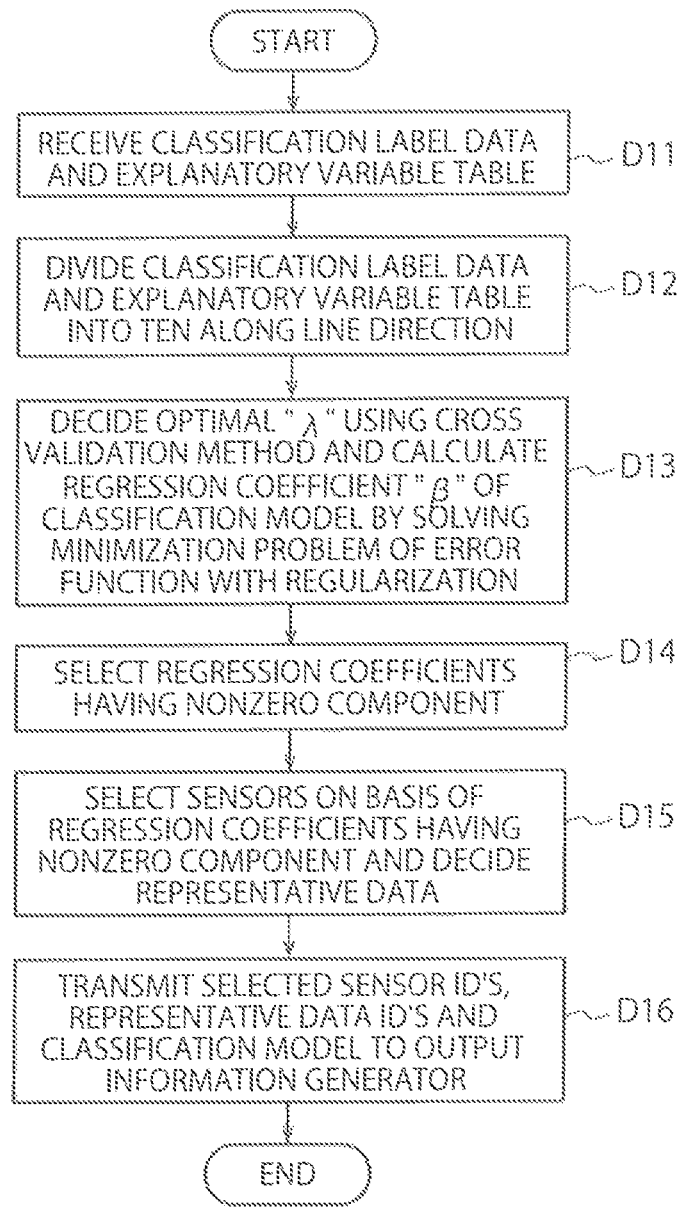
FIG. 19 is a diagram showing a detailed operation flow of a model constructor.

Next, the model constructor 13 operates (A13 in FIG. A16). FIG. 19 shows a detailed operation flow of the model constructor 13. The model constructor 13 receives the classification label data and the explanatory variable table (D11). The explanatory variable table is divided into a plurality of tables along the line direction (D12). For example, the explanatory variable table is divided into ten. Similarly, the classification label data is divided into the same number to correspond to the division of the explanatory variable table (D12). For example, when learning data IDs are in a range of 1 to 100, the explanatory variable table is divided into ten of "k=1 to 10, 11 to 21, . . . , 91 to 100" along the line direction, and, similarly, the classification label data is divided into ten of "k=1 to 10, 11 to 21, . . . , 91 to 100". The divided explanatory variable tables and the divided pieces of classification label data are mutually associated.

Then, the penalty term "λ" is decided using the cross validation method, and a regression coefficient "β" is calculated by solving a minimization problem of an error function with regularization (D13). Nonzero regression coefficients are selected from among all elements of the regression coefficient "β" (D14). On the basis of the selected regression coefficients, sensors and learning data are decided as recommended sensors and representative data, respectively (D15). Sensor IDs of the selected sensors (selected sensor IDs), learning data IDs of the representative data (representative data IDs) and a classification model are provided to the output information generator 14 (D16). The output information generator 14 generates output information on the basis of the provided pieces of information. As an example, the output information includes the selected sensor ID, the representative data ID and the classification model. The output information generator 14 may display the output information on a screen of the input/output device 2.

Classification using the generated classification model can be performed by mounting the classification model on a computer having a configuration similar to the configuration in FIG. 15. The classification model is stored in the storage device 105, and the processor 101 reads out and executes the classification model. Sensors of the selected sensor IDs (here, it is assumed that there are a plurality of selected sensor IDs) are attached to a monitoring target (such as MFP), and the communication device 104 of the computer acquires sensor data from the plurality of sensors and stores the sensor data into the storage device 105. At this time, for each sensor, the processor 101 acquires sensor data when a condition shown by the representative data ID of the sensor is satisfied. The processor 101 calculates a classification model on the basis of the sensor data acquired from the sensors and calculates a probability of the monitoring target being normal (a probability of the classification label being 1). A judgment on whether normal or anomalous is made on the basis of the calculated probability. As an example, if the calculated probability is equal to or above a threshold, a judgment of being normal is made. If the calculated probability is below the threshold, a judgment of being anomalous is made. A judgment result may be displayed on the display device 103. Further, the judgment result may be stored into the storage device 105. If the judgment result shows being anomalous, the processor 101 may transmit an anomaly message to an administrator's apparatus via the communication device 104. Further, an alarm may be sounded via a speaker not shown.

As described above, according to the present invention, it is possible to, for a classification problem (such as anomaly detection), automatically select sensors to be attached to a monitoring target from a plurality of sensors. Further, it is possible to automatically select conditions for acquiring sensor data from the selected sensors, from among a plurality of conditions. Further, it is possible to automatically perform classification model construction using the selected sensors and sensor data acquired when the selected conditions are satisfied. Further, it is possible to perform the selection of sensors, the selection of conditions (selection of representative data) and the classification model construction collectively (i.e. at one time). Therefore, a classification model can be efficiently and accurately constructed. It is possible to, by providing information on IDs of the selected sensors, representative data IDs and the classification model to the designer; support selection of sensors by the designer. At the time of actual operation of the classification model, data is collected from the selected sensors when the selected conditions are satisfied, and, therefore, the number of sensors and the number of pieces of data to be collected can be reduced. Therefore, it is possible to reduce cost and make the classification model compact. Further, by the classification model being compact, it is possible to, at the time of actual operation, make a judgment based on the classification model at a high speed.

Second Embodiment

In the present embodiment, performance of a classification model and cost required in the case of using the classification model are presented to the designer via a user interface (UI).

Figure 20:
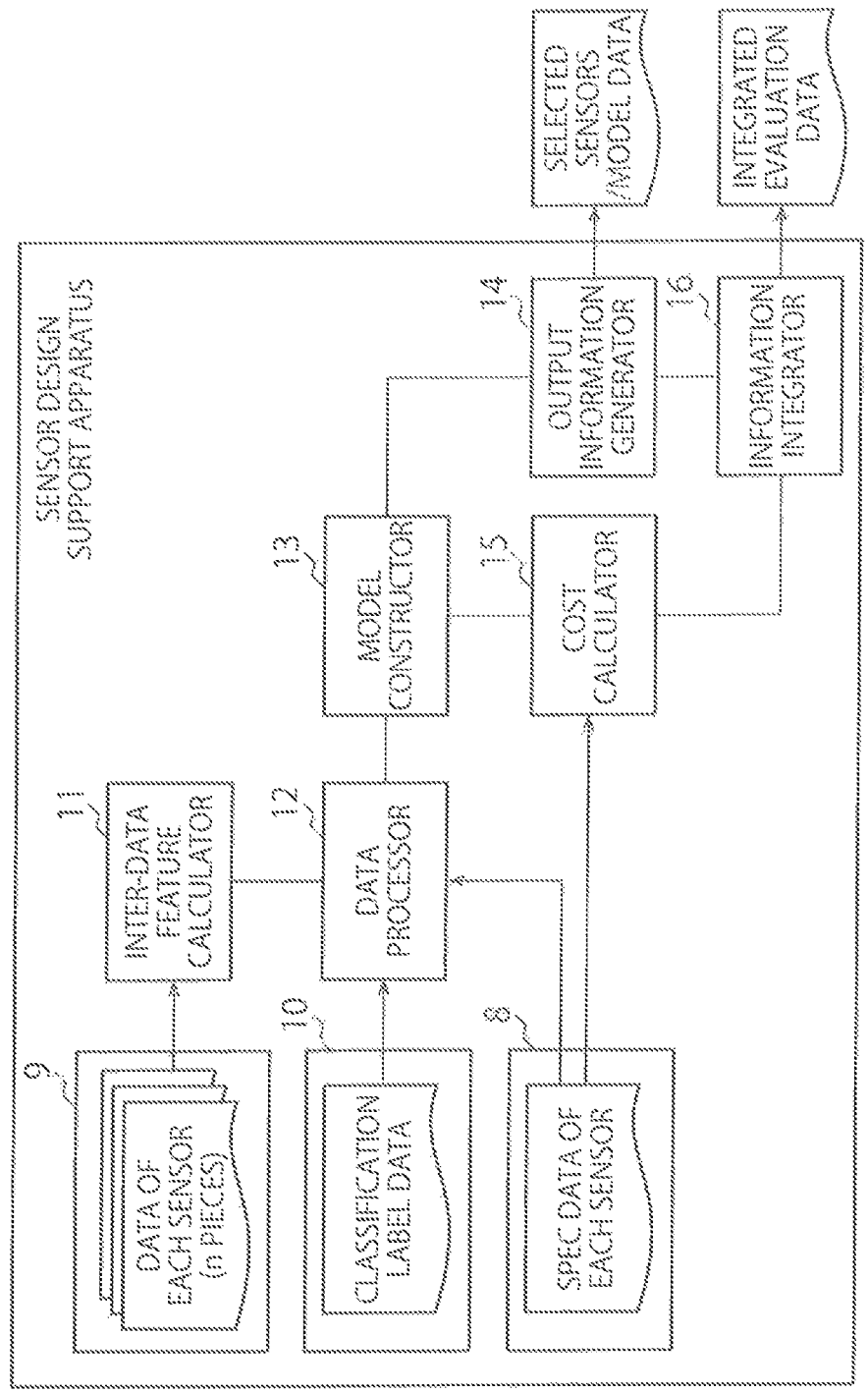
FIG. 20 is a block diagram of a system provided with a sensor design support apparatus according to a second embodiment.

FIG. 20 is a block diagram of a sensor design support apparatus according to the second embodiment. Differences from the first embodiment will be described, and repeated description of similar configurations and operations will be omitted.

In addition to the components of the first embodiment, the sensor design support apparatus is provided with a spec data holder 8, a cost calculator 15 and an information integrator 16, and a part of the operations of the data processor 12 and the model constructor 13 are extended or changed. The spec data holder 8 holds a spec data table that includes spec data of each sensor. The designer may register the spec data table with the spec data holder 8 using an input/output device, or a communication device (see FIG. 15) of the sensor design support apparatus may receive the spec data table via a network and store the spec data table into the spec data holder 8.

(Spec Data of Each Sensor)

FIG. 21 shows an example of the spec data table. As an example, this table includes spec data of the following items for each sensor.

Sampling frequency [Hz]
Sensor unit price [yen]
Continuous operating time [min]
DB capacity required for data storage [B]
Amount of power consumption of single sensor [kWh]

A value which can be calculated from the above plurality of items may be added to the spec data table. For example, a total amount of power consumption in the case of driving each sensor during the continuous operating time may be calculated from the continuous operating time and the amount of power consumption and added to the spec data table.

The model constructor 13 provides IDs of sensors selected by the operation of the first embodiment (selected sensor IDs) to the cost calculator 15.

The output information generator 14 calculates performance of a classification model constructed by the model constructor 13 on the basis of an inter-data feature table and classification label data of each sensor. The inter-data feature table and classification label data to be used may be the same as those used for constructing the classification model or may be different.

Examples of a performance index of a classification model are shown below.

Identification rate [%]
Processing time [s]
Classification model capacity [B]

The identification rate is a probability of obtaining correct classification result (for example, presence/absence of anomaly) with the classification model. The identification rate may be called a correct answer rate. The processing time is time required for making a judgment on anomaly presence/absence using the classification model. The classification model capacity includes at least the former between the data size of the classification model and the size of sensor data to be inputted to the classification model. The processing time may be actually measured using the constructed classification model and test sensor data or may be estimated in a predetermined method from the definition (or format) of the model, the size of input data and the like.

The output information generator 14 provides a calculated performance index to the information integrator 16. Further, the output information generator 14 also provides the selected sensor IDs, the representative data IDs and the classification model that have been provided from the model constructor 13 to the information integrator 16. The output information generator 14 may generate output information and provide the output information to the input/output device 2 similarly to the first embodiment.

The cost calculator 15 identifies spec data of corresponding sensors from the spec data table on the basis of the selected sensor IDs provided from the model constructor 13 and calculates cost from the identified spec data. The following examples are conceivable as cost indexes.

Installation cost [yen]
Operation cost [yen]
Required DB capacity [B]
Total amount of power consumption [kWh]

The installation cost includes, for example, purchase cost and attachment cost of sensors. The operation cost includes cost of periodic inspection and replacement as an example. The necessary DB capacity is a storage capacity for storing sensor data acquired by the sensors. The total amount of power consumption is a total amount of power consumption of all selected sensors. Total cost obtained by summing up operation cost during a certain period (for example, five years) may be calculated.

The cost calculator 15 provides the spec data of the selected sensors and the calculated cost to the information integrator 16.

The information integrator 16 generates integrated evaluation data on the basis of the selected sensor IDs, the representative data IDs, the classification model, the performance, the cost and the spec data. The integrated evaluation data includes a graph, for example, with a horizontal axis indicating the cost and a vertical axis indicating the performance. Further, the integrated evaluation data includes data on the cost and performance of the selected sensors. The information integrator 16 provides the integrated evaluation data to the input/output device 2. The input/output device 2 displays the integrated evaluation data on the screen.

FIG. 22 shows a display example of the integrated evaluation data. The integrated evaluation data is graphically displayed. In FIG. 22, "model 1" is a classification model generated in accordance with the present embodiment. In this example, the selected sensors are the sensor 1 and the sensor "n" ("$S_1$" and "$S_n$" in FIG. 22). The number of pieces of representative data of the sensor 1 is two, and the number of pieces of representative data of the sensor "n" is one.

The horizontal axis of the graph on the left side indicates cost. The cost can be selected from among three of installation cost, total cost of operation cost and sensor power. In FIG. 22, the total cost is selected. Further, the vertical axis indicates performance. The performance can be selected from three of processing time, identification rate and classification model capacity. In FIG. 22, the identification rate is selected.

On a display screen, the user interface (UI) for selecting each of a horizontal axis item and a vertical axis item is provided. The designer can select the items via the UI. By changing the items, display content can be updated.

A selection instruction by the designer is sent to the information integrator 16 from the input/output device 2, and the information integrator 16 regenerates the integrated evaluation data according to the instruction and sends the integrated evaluation data to the input/output device 2. The information integrator 16 may change the integrated evaluation data only for changed positions or may regenerate the whole integrated evaluation data.

Third Embodiment

The present embodiment introduces a mechanism for reflecting a condition specified by the designer on the operation related to classification model construction.

Figure 23:
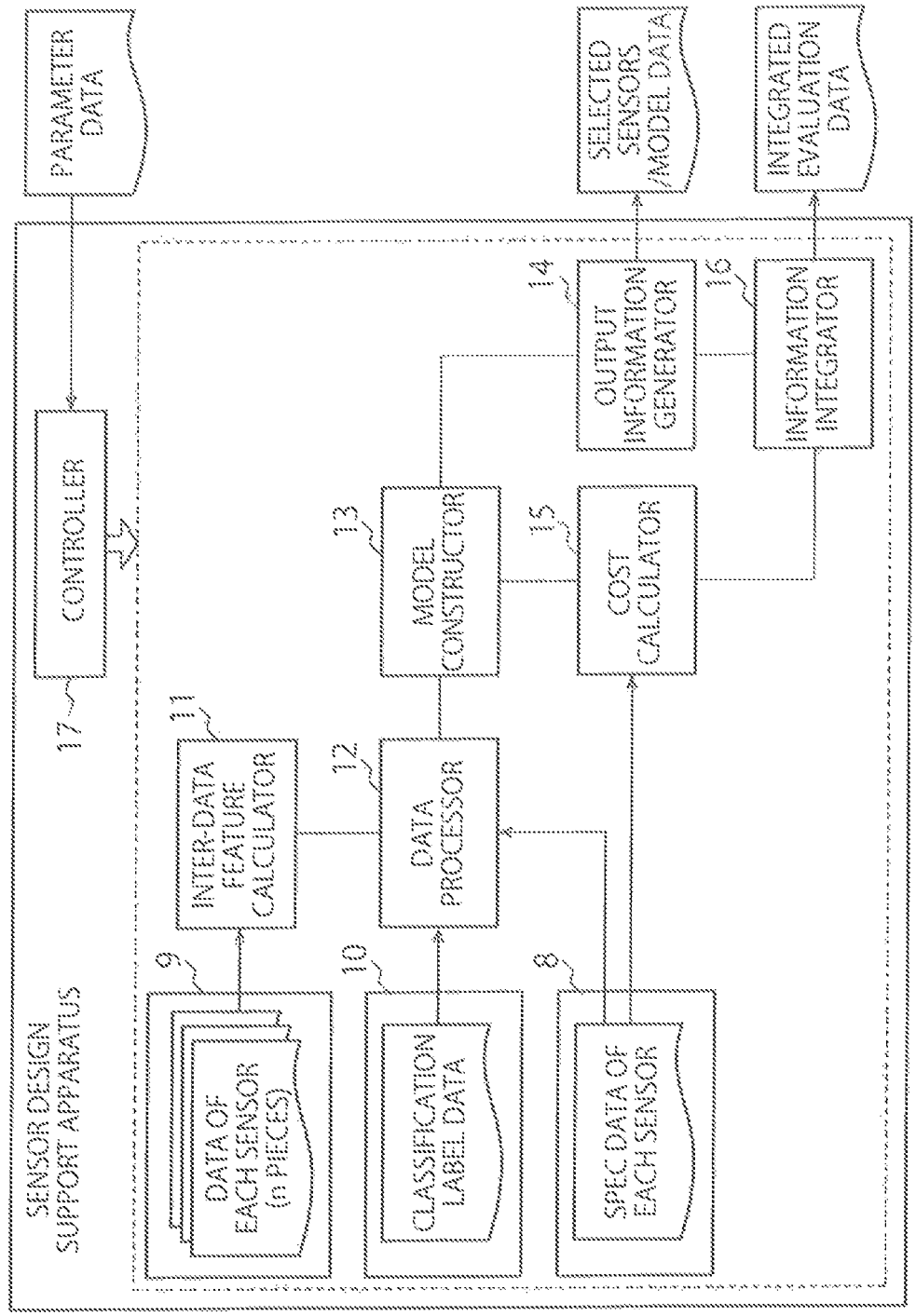
FIG. 23 is a block diagram of a system provided with a sensor design support apparatus according to a third embodiment.

FIG. 23 is a block diagram of a system provided with a sensor design support apparatus according to the present embodiment. A controller 17 is added to the sensor design support apparatus of the second embodiment. The controller 17 controls operations of blocks in the apparatus on the basis of control parameter data inputted by the designer via the input/output device 2. The designer can reflect his intention on classification model construction and the like by setting the control parameter data.

For example, in the case of desiring to perform anomaly detection, state monitoring or the like only with inexpensive sensors with a price equal to or below a certain price, input control parameter data specifying a condition for the desiring can be input to construct a classification model satisfying the condition. Further, it is possible to construct two or more classification models under different conditions and compare performance and cost among the classification models.

Further, the controller 17 may provide the condition written in the control parameter data to the information integrator 16, and the information integrator 16 may generate screen data including the condition and display the screen data on the screen of the input/output device 2. Thereby, the designer can know the condition he specified on the screen.

Specific examples of the control parameter data will be shown below. The pieces of control parameter data described below can be arbitrarily combined.

First Specific Example

There may be a case where it is desired to perform anomaly detection or state monitoring with inexpensive sensors with as low sampling frequency as possible (for example, a case where sensor data is time-series data is assumed).

In that case, the designer sets a condition specifying allowable performance (for example, an identification rate or processing time, or both of them) as described below for the control parameter data. Two examples of the condition to be specified with the control parameter data are shown below. Any one of conditions A and B or both of them may be specified. A condition A specifies that the identification rate is to be 80% or above. A condition B specifies that the processing time is to be three seconds or less.

Identification rate≥80 [%]             [Condition A]

Processing time≤3 [s]                [Condition B]

The model constructor 13 selects sensors with as low sampling frequency as possible to satisfy the condition specified with the control parameter data. The condition specified with the control parameter data functions as a constraint at the time of solving an optimization problem (a minimization problem). The used constraint may be displayed on the screen for integrated evaluation data (see the lower right of FIG. 22). Thereby, it is possible to provide information for supporting a judgment on whether more inexpensive sensors can be used, to the designer.

Second Specific Example

There may be a case where it is desired to restrict sensors to be used or performance of the sensors because of product specs and the like. In that case, by setting a condition as shown below in the control parameter data, it is possible to perform classification model construction in consideration of performance to be used (for example, a sampling frequency), sensors to be used or learning data IDs to be used. Among conditions C to E, one of them or a combination of two or three conditions may be specified.

Sampling frequency=100 [Hz]        [Condition C]

Used sensor IDs=2,4, . . . ,100        [Condition D]

Learning data IDs=1,5, . . . ,$k$          [Condition E]

An operation example in the case of specifying a sampling frequency condition like the condition C will be shown. The controller 17 connects to the data processor 12 and refers to spec data of each sensor acquired by the data processor 12. The controller 17 controls operation of the model constructor 13 so as not to select a sensor which does not satisfy a sampling frequency written in control parameter data. Instead of controlling the operation of the model constructor 13, the controller 17 may control the data processor 12 to delete values related to sensors not to be selected, from an explanatory variable table. Further, when sensor IDs to be used are directly specified as indicated by the condition D or when learning data IDs are directly specified as indicated by the condition E, the operation of the model constructor 13 or the like is similarly controlled so that the condition is specified.

Third Specific Example

There may be a case where there is a sensor desired to be used for a classification model in advance depending on the designer's intention. In that case, it is possible to set a condition as shown below in the control parameter data. The controller 17 controls the operation of the model constructor 13 so that at least the sensor specified in the control parameter data is selected.

Required sensor ID=1                 [Condition F]

Fourth Specific Example

There may be a case where it is desired to impose cost restriction depending on the designer's intention. In that case, it is possible to set, for example, a condition as shown below in the control parameter data.

Total cost<3 million                 [Condition G]

Though an example of the total cost is shown here, cost on which a restriction is to be imposed may be installation cost for each sensor or total installation cost. Otherwise, power consumption for each sensor or total power consumption is also possible.

Fifth Specific Example

There may be a case where it is desired to compare a plurality of classification models on the designer's intention. For that purpose, a condition for the number of classification models and conditions for each classification model can be set in the control parameter data as shown below.

The number of a plurality of classification models=2 [Condition G]

Conditions for Each Classification Model

As the conditions for each classification model, the conditions shown in the first to third specific examples may be used. As conditions different from the conditions, a function definition of classification model may be different for each classification model. Or, an objective function may be different for each classification model while the same function definition is used. Or, other conditions may be different for each classification model.

An operation example of the fifth specific example, the controller 17 performs control so that, for each classification model, selection of sensors and representative data, construction of the classification model and calculation of performance and cost are performed in accordance with the conditions set in the control parameter data. Then, the information integrator 16 may generate integrated evaluation data in which classification models can be compared.

Figure 24:
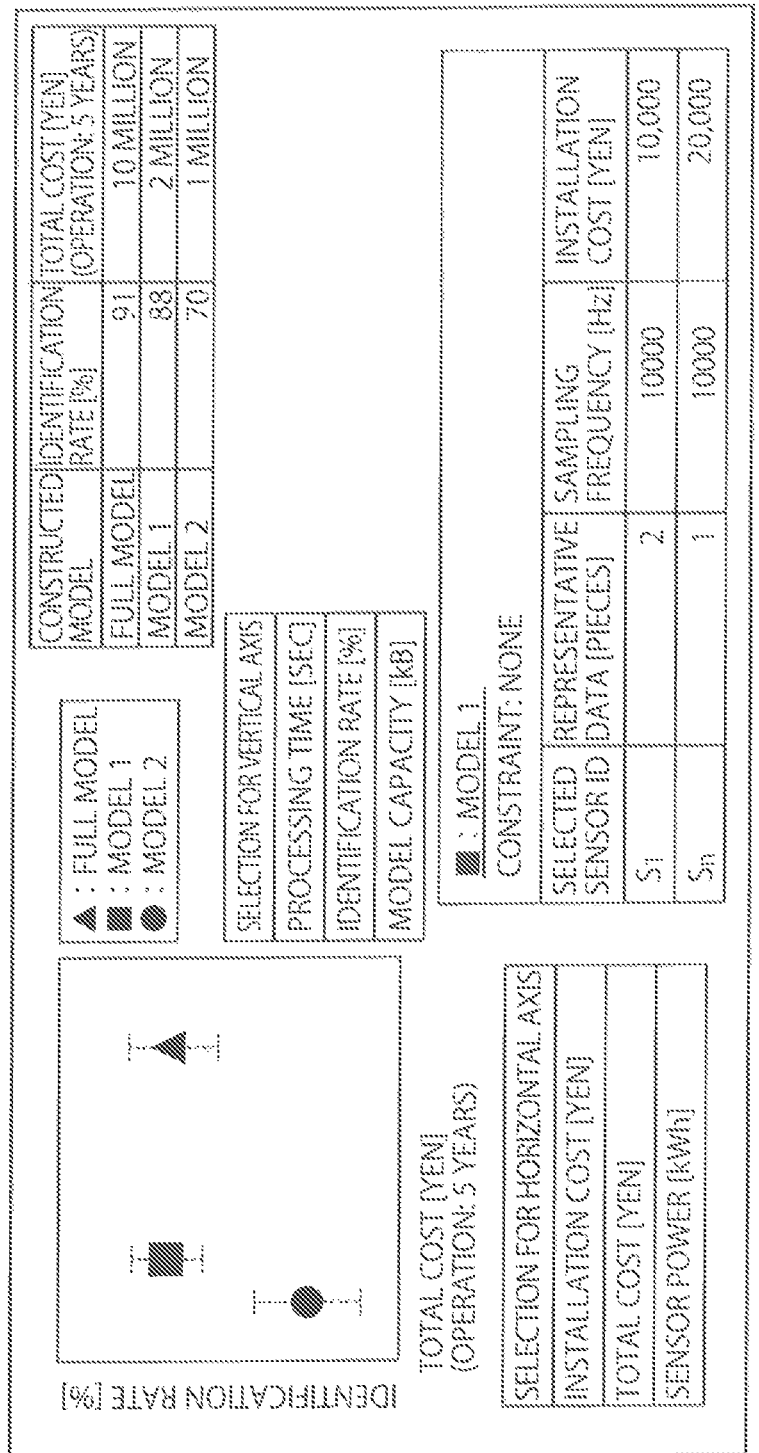
FIG. 24 is a diagram showing a display example of screen data.

FIG. 24 shows a display example of the integrated evaluation data according to the fifth specific example. A graph is displayed for each of three classification models, "full model", "model 1" and "model 2". An item can be selected for each of the horizontal axis and vertical axis of the graphs, similarly to FIG. 22. The "full model" is a regular classification model for which all sensors and all sensor data are to be used (that is, a classification model generated in a related art). The "model 1" and the "model 2" are models generated under different conditions in accordance with the embodiment of the present invention. For example, the model 1 may be a classification model generated using Formula (4) as a penalty term, and the model 2 may be a classification model generated using Formula (6) as a penalty term. At the upper right of FIG. 24, a table showing an identification rate and total cost for each classification model is arranged. The designer can select each line of this table via the input/output device 2. Information related to a classification model of a line selected by the designer is displayed at the lower right of FIG. 24. In FIG. 24, information in the case of the classification model 1 being selected is shown. Specifically, selected sensors, representative data, sampling frequency and installation cost are displayed.

Fourth Embodiment

In the embodiments described above, an explanatory variable table obtained by combining inter-data feature tables of a part or all of the sensors 1 to "n" (see FIG. 12) is generated. However, a classification model may be created for an inter-data feature table of each individual sensor. In this case, the same number of classification models as sensors can be generated. One or more classification models are selected from among the classification models of the sensors, in descending order of identification rate. An identification rate of a selected classification model is a probability of correctly performing classification of anomaly presence/absence with the classification model (a correct answer rate). Until target performance specified by the user is reached, classification models are selected such that a classification model with a higher identification rate is selected preferentially. For example, in the case of performing classification (normality/anomaly judgment) with the selected classification models and adopting a classification result (a judgment result) the number of which is larger as a result of majority vote, it is repeated to add one classification model in descending order of identification rate until a probability of the judgment result being a correct answer reaches target performance specified by the user. If the number of normality judgment results and the number of anomaly judgment results are the same, an average or maximum value of probabilities outputted by classification models giving the normality judgment result and an average or maximum value of probabilities outputted by classification models giving the anomaly judgment result may be compared to adopt a judgment result with a larger value.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions.

The invention claimed is:

1. An information processing apparatus comprising:
communication circuitry configured to receive first to k-th data detected by each of a plurality of sensors at first to k-th timings, the sensors monitoring a target, and receive actual values of a state of the target at the first to k-th timings;
a hardware storage configured to store the first to k-th data to be associated with the first to k-th timings for each of the sensors, and the state values; and
processing circuitry configured to:
read the first to k-th data associated with the first to k-th timings for each of the sensors from the hardware storage,
combine any two pieces of the first to k-th data for each of the sensors to generate a plurality of data pairs for each of the sensors,
perform data processing on each pair of the plurality of data pairs to obtain a plurality of inter-data features corresponding to the plurality of data pairs for each of the sensors,
generate a classification model providing a predicted value of a state of the target by performing regression of a state of the target on the plurality of inter-data features of the sensors weighted by a plurality of coefficients corresponding to the sensors,
generate a first function including a loss function of differences between predicted values of the classification model and the actual values of the state of the target and including a penalty term including the plurality of coefficients,
solve the first function to find values of the plurality of coefficients, and
select at least one sensor from among the plurality of sensors on the basis of the values of the plurality of coefficients,
wherein
the communication circuitry is configured to receive data detected by the selected sensor and not receive data from a non-selected sensor, and
the processing circuitry is configured to calculate a predicted value of a state of the target based on the data received from the selected sensor and the classification model and diagnose the target based on the predicted value.

2. The information processing apparatus according to claim 1, wherein
the plurality of coefficients further correspond to the first to k-th timings,
the processing circuitry selects at least one timing from among the first to k-th timings on the basis of the values of the plurality of coefficients, and
the communication circuitry is configured to receive data at the selected timing from the selected sensor and not receive data at non-selected timing from the selected sensor.

3. The information processing apparatus according to claim 1, wherein
the processing circuitry selects a nonzero coefficient from among the plurality of coefficients,
selects a sensor corresponding to the nonzero coefficient, and
does not select a sensor corresponding to a coefficient of zero.

4. The information processing apparatus according to claim 1, wherein the processing circuitry minimizes the first function to find the plurality of coefficients.

5. The information processing apparatus according to claim 1, wherein
the penalty term includes constants corresponding to the plurality of sensors,
the sensors have priority values, and
sensors having a higher priority value have a smaller constraint value.

6. The information processing apparatus according to claim 2, wherein
the processing circuitry selects a coefficient of nonzero from among the plurality of coefficients, selects a timing corresponding to the coefficient of nonzero, and does not select a timing corresponding to a coefficient of zero.

7. The information processing apparatus according to claim 1, wherein at least one another target different from the target is to be installed with the selected sensor for monitoring the at least another target, and not to be installed with the non-selected sensor.

8. An information processing method comprising:
receiving first to k-th data detected by each of a plurality of sensors at first to k-th timings, the sensors monitoring a target, and receiving actual values of a state of the target at the first to k-th timings;
storing, in a hardware storage, the first to k-th data to be associated with the first to k-th timings for each of the sensors, and the state values;
reading the first to k-th data associated with the first to k-th timings for each of the sensors from the hardware storage;
combining any two pieces of the first to k-th data for each of the sensors to generate a plurality of data pairs for each of the sensors;
performing data processing on each pair of the plurality of data pairs to obtain a plurality of inter-data features corresponding to the plurality of data pairs for each of the sensors;
generating a classification model providing a predicted value of a state of the target by performing regression of a state of the target on the plurality of inter-data features of the sensors weighted by a plurality of coefficients corresponding to the sensors;
generating a first function including a loss function of differences between predicted values of the classification model and the actual values of the state of the target and including a penalty term including the plurality of coefficients;
solving the first function to find values of the plurality of coefficients;
selecting at least one sensor from among the plurality of sensors on the basis of the values of the plurality of coefficients; and
receiving data detected by the selected sensor and not receiving data from a non-selected sensor; and
calculating a predicted value of a state of the target based on the data received and the classification model and diagnosing the target based on the predicted value.

9. A non-transitory computer readable medium having a program stored therein which causes, when executed by a computer, the computer to execute processing comprising:
receiving first to k-th data detected by each of a plurality of sensors at first to k-th timings, the sensors monitoring a target, and receiving actual values of a state of the target at the first to k-th timings;
storing, in a hardware storage, the first to k-th data to be associated with the first to k-th timings for each of the sensors, and the state values;
reading the first to k-th data associated with the first to k-th timings for each of the sensors from the hardware storage;
combining any two pieces of the first to k-th data for each of the sensors to generate a plurality of data pairs for each of the sensors;
performing data processing on each pair of the plurality of data pairs to obtain a plurality of inter-data features corresponding to the plurality of data pairs for each of the sensors;
generating a classification model providing a predicted value of a state of the target by performing regression of a state of the target on the plurality of inter-data features of the sensors weighted by a plurality of coefficients corresponding to the sensors;
generating a first function including a loss function of differences between predicted values of the classification model and the actual values of the state of the target and including a penalty term including the plurality of coefficients;
solving the first function to find values of the plurality of coefficients;
selecting at least one sensor from among the plurality of sensors on the basis of the values of the plurality of coefficients;
receiving data detected by the selected sensor and not receiving data from a non-selected sensor; and
calculating a predicted value of a state of the target based on the data received and the classification and diagnosing the target based on the predicted value.

* * * * *

UNITED STATES PATENT AND TRADEMARK OFFICE
CERTIFICATE OF CORRECTION

PATENT NO. : 11,163,853 B2
APPLICATION NO. : 15/696352
DATED : November 2, 2021
INVENTOR(S) : Arika Fukushima et al.

Page 1 of 1

It is certified that error appears in the above-identified patent and that said Letters Patent is hereby corrected as shown below:

In the Claims

Claim 8, Column 25, Line 33, "coefficients; and" should read --coefficients;--.

Signed and Sealed this
Eleventh Day of October, 2022

Katherine Kelly Vidal
*Director of the United States Patent and Trademark Office*